United States Patent
Noma

(10) Patent No.: US 7,203,108 B2
(45) Date of Patent: Apr. 10, 2007

(54) RELIABILITY TEST METHOD FOR A FERROELECTRIC MEMORY DEVICE

(75) Inventor: Atsushi Noma, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 68 days.

(21) Appl. No.: 11/228,317

(22) Filed: Sep. 19, 2005

(65) Prior Publication Data

US 2006/0104133 A1     May 18, 2006

(30) Foreign Application Priority Data

Nov. 12, 2004   (JP)  ............... 2004-329441

(51) Int. Cl.
*G11C 7/00* (2006.01)
*G11C 11/22* (2006.01)
(52) U.S. Cl. ............................. 365/201; 365/145
(58) Field of Classification Search ................ 365/201, 365/145
See application file for complete search history.

(56) References Cited

U.S. PATENT DOCUMENTS 5,337,279 A * 8/1994 Gregory et al. ............. 365/201
5,525,528 A * 6/1996 Perino et al. .................. 438/3
7,085,150 B2 * 8/2006 Rodriguez et al. .......... 365/145
7,149,137 B2 * 12/2006 Rodriguez et al. .......... 365/145

FOREIGN PATENT DOCUMENTS

JP     11-102600 A     4/1999

* cited by examiner

*Primary Examiner*—Anh Phung
(74) *Attorney, Agent, or Firm*—McDermott Will & Emery LLP

(57) ABSTRACT

A reliability test method for a ferroelectric memory device having a ferroelectric capacitor evaluates, under acceleration conditions (acceleration temperature $T_2$ and test time $t_2$), whether or not life of retention characteristics of the ferroelectric memory device is guaranteed under actual use conditions (guarantee temperature $T_1$ and guarantee time $t_1$). The method includes the step of determining test time $t_2$ that is required to evaluate whether the life of the retention characteristics is guaranteed or not, based on temperature dependence of change with time of a bit line voltage that is generated when data written to the ferroelectric memory device is read.

13 Claims, 25 Drawing Sheets

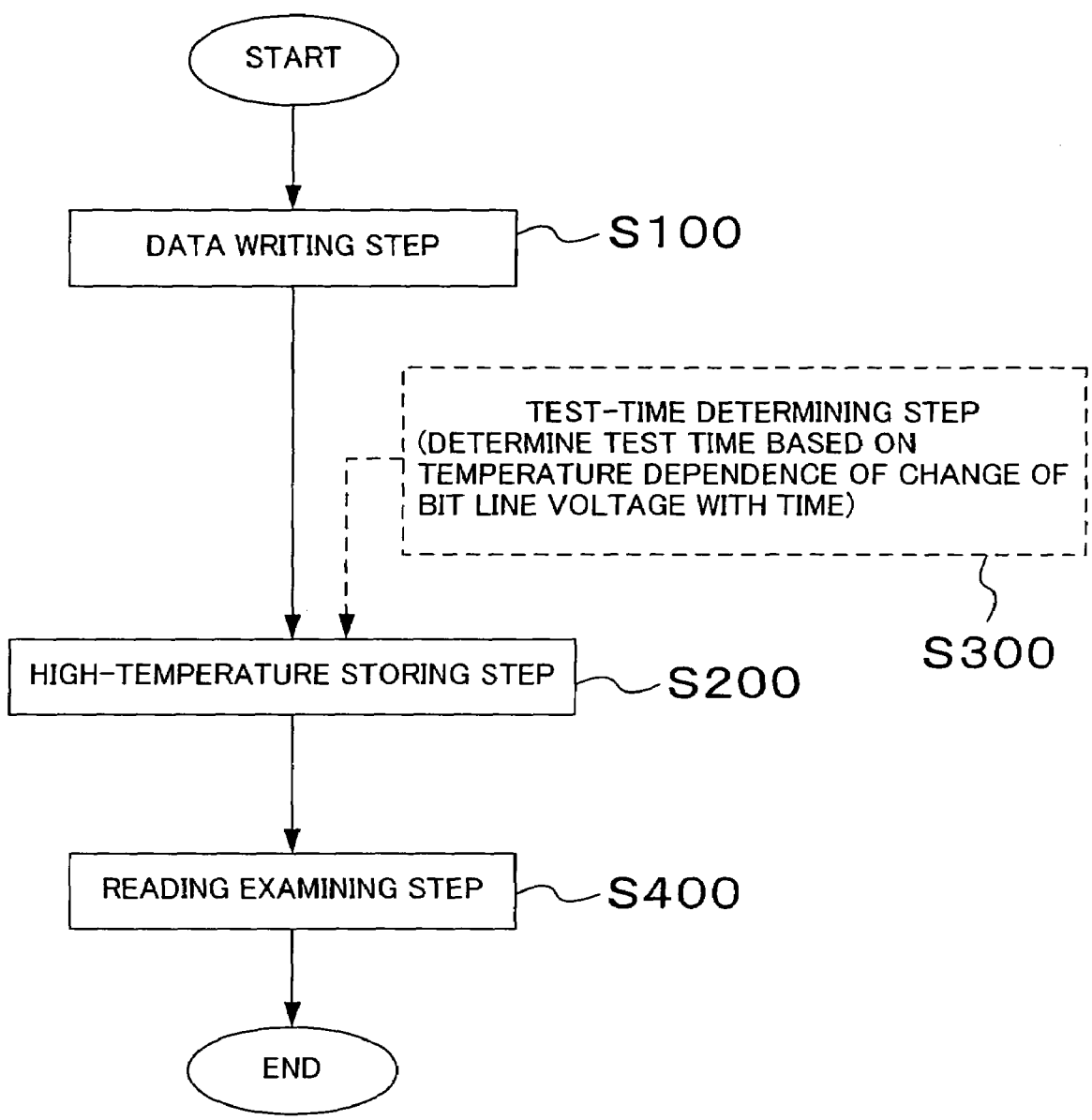

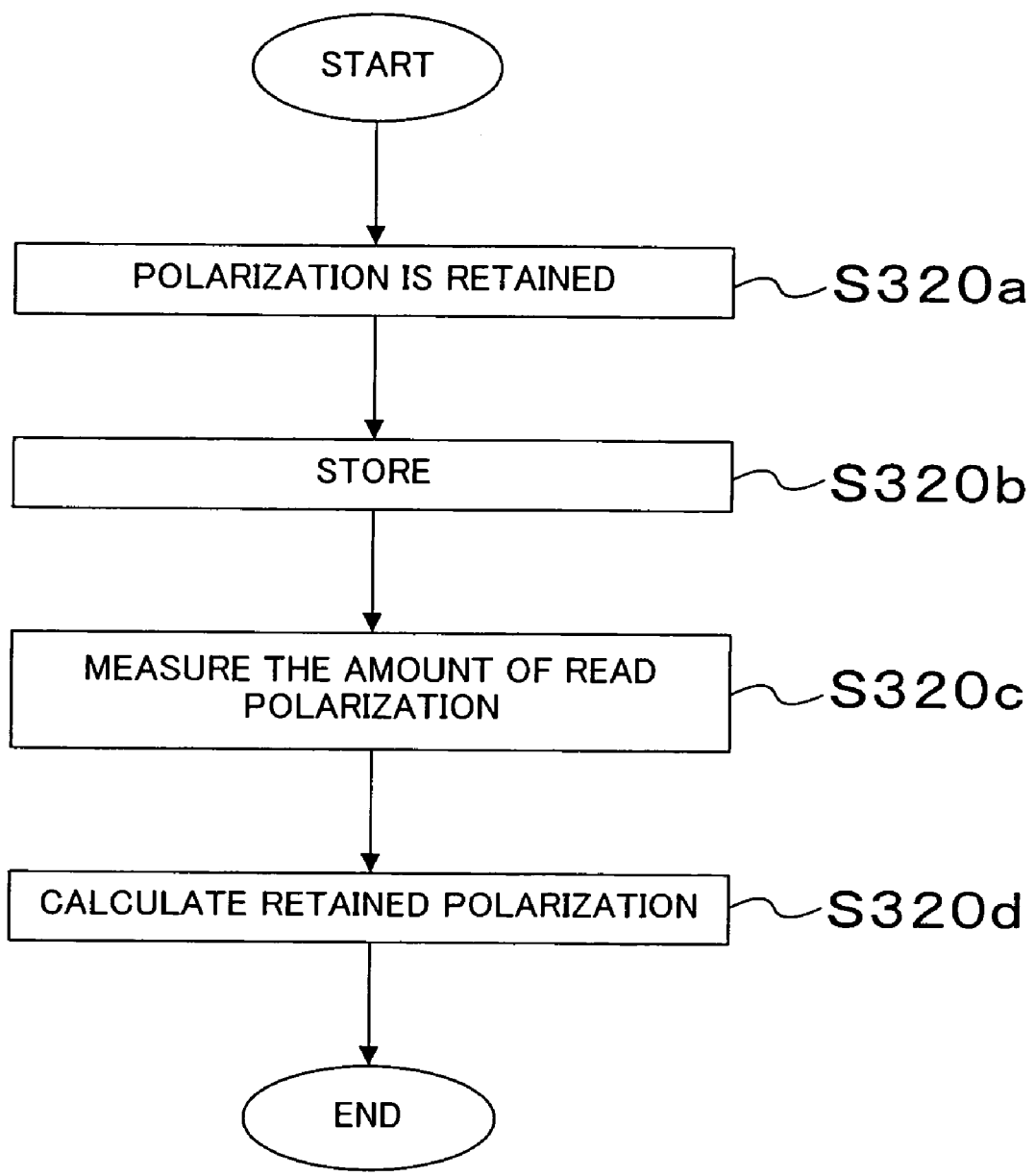

RELIABILITY TEST METHOD FOR A FERROELECTRIC MEMORY DEVICE

CROSS REFERENCE TO RELATED APPLICATIONS

This application claims priority under 35 U.S.C. §119 on Patent Application No. 2004-329441 filed in Japan on Nov. 12, 2004, the entire contents of which are hereby incorporated by reference.

BACKGROUND OF THE INVENTION

The present invention relates to a test method for evaluating reliability of a ferroelectric memory device that includes a capacitor having a capacitor insulating film of a ferroelectric material.

Recent rapid growth of digital technologies has been accelerating the trend toward high-speed processing and storage of larger volumes of information. Therefore, higher integration and higher performance have been demanded for semiconductor memory devices which are used in electronic equipments. In response to such demands, ferroelectric memory devices that use ferroelectric capacitors having spontaneous polarization characteristics as capacitors of semiconductor memory devices have been actively studied and developed. Ferroelectric capacitors included in ferroelectric memory devices have a property that the polarization direction of ferroelectric capacitors is easily inverted by application of a relatively low external voltage. Ferroelectric memory devices are memory devices which store a certain polarization direction as "0" and the opposite polarization direction as "1" by using this ferroelectric capacitors' property. The ferroelectric memory devices are characterized by high-speed write/read operation with a voltage that is lower than that in the conventional examples. Moreover, polarization of ferroelectric capacitors is held as residual polarization which does not disappear even when the external voltage is removed. Non-volatile memories capable of retaining stored data for a long time even in the power-off state can be implemented by using this ferroelectric capacitors' property.

In general, some characteristic tests in view of physical properties of ferroelectric capacitors are conducted in the reliability test for such ferroelectric memory devices. One of the characteristic tests is a retention characteristic test in view of depolarization characteristics of ferroelectric capacitors.

When a ferroelectric capacitor retaining polarization of one direction is stored, the retained polarization reduces with time. Such characteristics of ferroelectric capacitors are called depolarization. The depolarization characteristics affect data retention characteristics (retention characteristics) of ferroelectric memory devices. The retention characteristics are characteristics of whether or not data can be read from a ferroelectric memory device after the ferroelectric memory device has retained data of one direction for a long time. When depolarization of a ferroelectric capacitor is extremely large, the data cannot be retained, and therefore, cannot be read from the ferroelectric memory device (read failure).

In view of the above characteristics of ferroelectric capacitors, the retention characteristic test of a ferroelectric memory device examines whether or not data can be read from a ferroelectric memory device after the ferroelectric memory device has retained data of one direction for a period corresponding to the data retention guarantee time. The retention characteristic test is the most basic reliability test for evaluating capability of a ferroelectric memory device as a non-volatile memory, and is widely used in various applications.

An acceleration test is used to carry out the reliability test within a limited period of time. In the acceleration test, reliability is evaluated by using more stressed conditions than actual use conditions. Data retention guarantee time of ferroelectric memory devices is usually 10 years. In order to carry out the retention characteristic test of a ferroelectric memory device within a short period of time, the acceleration test uses excessively stressed conditions and evaluates the retention characteristics of ferroelectric memory devices after the ferroelectric memory devices has retained data for a period corresponding to 10 years. A temperature stress is commonly used in the acceleration test. In other words, an excess temperature is applied to the ferroelectric memory devices.

In the acceleration test using a temperature stress (hereinafter, referred to as "temperature acceleration test"), the test corresponding to guarantee time $t_1$ required for a guarantee temperature $T_1$ is conducted by using an acceleration temperature $T_2$ higher than the guarantee temperature $T_1$ in order to reduce the time required for the test from guarantee time $t_1$ to test time $t_2$. In order to conduct the temperature acceleration test, it is required to determine in advance the test time $t_2$ for the acceleration temperature $T_2$ corresponding to the guarantee time $t_1$ for the guarantee temperature $T_1$. The relation between the guarantee time $t_1$ and the test time $t_2$ varies depending on temperature dependence of reliability characteristics to be tested. Therefore, the test time $t_2$ is commonly determined by selecting a parameter relating to the reliability characteristics and measuring temperature dependence of the selected parameter.

For example, the time a ferroelectric memory device becomes defective due to the reliability characteristics to be tested, that is, the "life" of a ferroelectric memory device, is selected as a parameter, and the test time $t_2$ is determined based on temperature dependence of the life. However, in the case where the life of the ferroelectric memory device is used as a parameter, no information about temperature dependence of the life can be obtained until the ferroelectric memory device's life actually expires. Therefore, it often takes a lot of time to determine the test time.

As for ferroelectric memory devices, "retained polarization," polarization that is retained in a ferroelectric capacitor when data is written to a ferroelectric memory device, is commonly selected as a parameter, and the test time is determined based on temperature dependence of change of retained polarization with time (e.g., Japanese Laid-Open Patent Publication No. 11-102600). Change of retained polarization with time can be obtained from right after the measurement is started, regardless of the life of the ferroelectric memory device. Accordingly, the test time can be determined in a relatively short time based on temperature dependence of the change of retained polarization with time.

Hereinafter, a conventional method for testing retention characteristics of a ferroelectric memory device will be described with reference to the accompanying drawings.

FIG. 23 is a flowchart of the conventional method for testing retention characteristics of a ferroelectric memory device.

In a data writing step S10, data of one direction is written to a ferroelectric memory device.

In a high-temperature storing step S20, the ferroelectric memory device is stored at an acceleration temperature $T_2$ for prescribed test time $t_2$. The acceleration temperature $T_2$ is higher than a guarantee temperature $T_1$.

In a test-time determining step S30, the prescribed test time $t_2$ is determined based on temperature dependence of change of retained polarization with time. The retained polarization is polarization that is retained in a ferroelectric capacitor when the data is written to the ferroelectric memory device. The test-time determining step S30 is conducted separately.

Whether the data retained in the ferroelectric memory device can be read or not is examined in a reading examining step S40 and the test is completed.

The test-time determining step S30 will now be described in detail.

As described above, in the temperature acceleration test, the test time is determined by selecting a specific parameter relating to reliability characteristics to be tested and measuring temperature dependence of the selected parameter. As mentioned earlier, retention characteristics of a ferroelectric memory device are affected by depolarization characteristics of ferroelectric capacitors of the ferroelectric memory device (characteristics that polarization retained in a ferroelectric capacitor decreases with time). Therefore, in the test-time determining step S30, retained polarization is selected as a parameter, and the test time $t_2$ is determined based on temperature dependence of change of retained polarization with time.

For example, as shown in FIG. 24, change of retained polarization $P_{SS}$ with time is first obtained for both the guarantee temperature $T_1$ and the acceleration temperature $T_2$. Retained polarization $P_{SS}'$ after the guarantee time $t_1$ at the guarantee temperature $T_1$ is then obtained. Thereafter, the time the retained polarization $P_{SS}$ of the acceleration temperature $T_2$ becomes equal to the value $P_{SS}'$ is obtained. The time thus obtained is determined as test time $t_2$. By using the test time $t_2$ and the acceleration temperature $T_2$, the condition after the guarantee time $t_1$ at the guarantee temperature $T_1$ can be reproduced in a short period of time. As a result, the temperature acceleration test of retention characteristics can be conducted.

When the data can be read from the ferroelectric memory device in the reading examining step S40, that is, when read failure does not occur in the reading examining step S40, it can be evaluated that retention characteristics of the ferroelectric memory device can be guaranteed for at least guarantee time t, at the guarantee temperature $T_1$.

SUMMARY OF THE INVENTION

However, the conventional method for testing retention characteristics of a ferroelectric memory device has the following problems:

As described above, in the conventional method for testing retention characteristics of a ferroelectric memory device, retained polarization (polarization that is retained in ferroelectric capacitors when data is written to a ferroelectric memory device) is selected as a parameter, and test time is determined based on temperature dependence of change of the retained polarization with time. The most important point of this method is that the selected parameter needs to change with time. In other words, the retained polarization selected as a parameter needs to actually decrease (change) with time due to depolarization characteristics.

Ferroelectric capacitors have imprint characteristics in addition to the depolarization characteristics. The imprint characteristics are characteristics that when a ferroelectric capacitor retaining polarization of one direction is stored, the polarization of that direction retained therein is stabilized. Therefore, the polarization retained in ferroelectric capacitors has two opposite tendencies: decrease due to the depolarization characteristics; and stabilization due to the imprint characteristics. Whether the retained polarization decreases with time or not depends on which of the two tendencies is stronger. In general, the latter tendency (stabilization) is overwhelmingly strong. Therefore, retained polarization of ferroelectric capacitors hardly changes with time due to the stabilizing effect of the imprint characteristics.

FIG. 25 shows the measurement result of change of retained polarization $P_{SS}$ with time for the guarantee temperature $T_1$ of 85° C. and the acceleration temperature $T_2$ of 125° C. As shown in FIG. 25, the retained polarization $P_{SS}$ becomes smaller as the temperature becomes higher. However, the retained polarization $P_{SS}$ hardly decreases with time. In other words, the retained polarization $P_{SS}$ does not change with time.

As described above, when the selected parameter does not change with time, the test time cannot be determined. In other words, since the retained polarization $P_{SS}$ does not change with time while the ferroelectric memory device is stored, the test time $t_2$ at the acceleration temperature $T_2$ corresponding to the guarantee time $t_1$ at the guarantee temperature $T_1$ cannot be determined in the method of FIG. 24.

In the conventional method for testing retention characteristics of a ferroelectric memory device, retained polarization of a ferroelectric capacitor is selected as a parameter in the test-time determining step S30. Since the retained polarization does not change with time, the test time cannot be determined. Therefore, the temperature acceleration test for testing retention characteristics of a ferroelectric memory device cannot be conducted.

In view of the above problems, it is an object of the present invention to provide a reliability test method which is capable of testing retention characteristics of a ferroelectric memory device by reliably determining test time that is required for a temperature acceleration test of retention characteristics of a ferroelectric memory device.

In order to achieve the above object, according to an aspect of the present invention, a reliability test method for a ferroelectric memory device having a ferroelectric capacitor evaluates, under acceleration conditions (acceleration temperature $T_2$ and test time $t_2$), whether or not life of retention characteristics of the ferroelectric memory device is guaranteed under actual use conditions (guarantee temperature $T_1$ and guarantee time $t_1$). The method includes the step of determining test time $t_2$ that is required to evaluate whether the life of the retention characteristics is guaranteed or not, based on temperature dependence of change with time of a bit line voltage that is generated when data written to the ferroelectric memory device is read.

In the step of determining the test time $t_2$, the bit line voltage is used as a parameter relating to the retention characteristics of the ferroelectric memory device. Therefore, change of the parameter with time which is required to conduct the temperature acceleration test of the retention characteristics of the ferroelectric memory device, that is, change of the bit line voltage with time, can be reliably obtained. As a result, the test time $t_2$ can be reliably determined based on temperature dependence of the change of the bit line voltage with time.

Preferably, the above reliability test method further includes the steps of: writing data to the ferroelectric memory device; storing the data written to the ferroelectric memory device at the acceleration temperature $T_2$ for the test time $t_2$ determined by the step of determining the test time $t_2$; and examining, after the step of storing the data, whether or not the data written to the ferroelectric memory device can be read.

Since the data written to the ferroelectric memory device is stored at the acceleration temperature $T_2$ for the test time $t_2$ that is reliably determined by the step of determining the test time $t_2$, the condition after the guarantee time $t_1$ at the guarantee temperature $T_1$ can be reliably reproduced. As a result, the reliability test for evaluating whether the life of the retention characteristics of the ferroelectric memory device can be guaranteed or not can be reliably conducted.

Preferably, the bit line voltage is determined based on an intersection of a polarization-voltage hysteresis curve obtained by using an independent ferroelectric capacitor for evaluation which has the same structure as that of the ferroelectric capacitor of the ferroelectric memory device and a bit line capacitance load line of the ferroelectric memory device. The polarization-voltage hysteresis curve is obtained by reading retained polarization corresponding to data written to the ferroelectric memory device from the independent ferroelectric capacitor.

Although it is difficult to measure a bit line voltage by using the ferroelectric memory device, a bit line voltage can be extremely easily measured by using the independent ferroelectric capacitor for evaluation having the same structure as that of the ferroelectric capacitor of the ferroelectric memory device. In other words, a polarization-voltage hysteresis curve is measured by reading the retained polarization corresponding to the data written to the ferroelectric memory device from the independent ferroelectric capacitor. As a result, the bit line voltage can be extremely easily determined based on the intersection of the polarization-voltage hysteresis curve and the bit line capacitance load line. For example, the bit line voltage can be determined graphically from the intersection. Based on temperature dependence of change of the bit line voltage with time, the test time $t_2$ can be easily and reliably determined. Note that the independent ferroelectric capacitor for evaluation herein refers to a ferroelectric capacitor that has the same structure as that of the ferroelectric capacitor of the ferroelectric memory device to be actually tested and that has no other elements (such as transistors) connected thereto.

Preferably, the test time $t_2$ is determined based on respective changes of the bit line voltage with time at the guarantee temperature $T_1$ and the acceleration temperature $T_2$.

In this case, the test time $t_2$ can be reliably determined when the acceleration temperature $T_2$ is determined in advance.

Preferably, the test time $t_2$ is determined by obtaining a value of the bit line voltage after the guarantee time $t_1$ at the guarantee temperature $T_1$ based on the change of the bit line voltage with time at the guarantee temperature $T_1$ and then obtaining, based on the change of the bit line voltage with time at the acceleration temperature $T_2$, a time period required for the bit line voltage at the acceleration temperature $T_2$ to reach the value of the bit line voltage after the guarantee time $t_1$ at the guarantee temperature $T_1$.

In this case, the test time $t_2$ can be accurately determined based on the respective changes of the bit line voltage with time measured at the guarantee temperature $T_1$ and the acceleration temperature $T_2$.

Preferably, the test time $t_2$ is determined by using an acceleration model equation that is derived based on the temperature dependence of the change of the bit line voltage with time and that describes the test time $t_2$ as a function of the acceleration temperature $T_2$.

By using the acceleration model equation derived based on the temperature dependence of the change of the bit line voltage with time, an appropriate acceleration temperature $T_2$ and corresponding test time $t_2$ can be simultaneously determined even when the acceleration temperature $T_2$ has not been determined in advance.

Preferably, the acceleration model equation is shown by the following equation:

$$\ln[t_2]=[(T_C-T_1)/(T_C-T_2)]^{1/2}\cdot\ln[t_1]+\{1-[(T_C-T_1)/(T_C-T_2)]^{1/2}\}\cdot(V_0/R_0),$$

where $T_C$ is a Curie temperature, and $V_0$ and $R_0$ are constants.

By using this acceleration model equation, test time $t_2$ at any acceleration temperature $T_2$ can be determined, and an appropriate acceleration temperature $T_2$ and corresponding test time $t_2$ can be reliably simultaneously determined.

Preferably, a value of $T_C$ in the acceleration model equation is determined by measuring temperature dependence of polarization $P_{SS}$ that is retained in the ferroelectric capacitor when data is written to the ferroelectric memory device.

As a result, the value of $T_C$ in the acceleration model equation can be easily and reliably determined, and the test time $t_2$ can be reliably determined by using the acceleration model equation.

Preferably, a value of $T_C$ in the acceleration model equation is determined based on a gradient and an intercept of a regression line that is obtained by plotting, against temperature, a square of polarization $P_{SS}$ that is retained in the ferroelectric capacitor when data is written to the ferroelectric memory device.

As a result, the value of $T_C$ in the acceleration model equation can be accurately determined based on the measured result of temperature dependence of the retained polarization $P_{SS}$.

Preferably, respective values of $V_0$ and $R_0$ in the acceleration model equation are determined by measuring temperature dependence of the change of the bit line voltage with time.

As a result, the respective values of $V_0$ and $R_0$ in the acceleration model equation can be easily and reliably determined, and the test time $t_2$ can be reliably determined by using the acceleration model equation.

Preferably, a value of $V_0$ in the acceleration model equation is determined from a gradient of a regression line that is obtained by plotting intercepts of regression lines at a plurality of temperatures against values of $[A(T_C-T)]^{1/2}$ at the plurality of temperatures, respectively (where $T_C$ is a Curie temperature and $A$ is a constant), and the regression lines at the plurality of temperatures are obtained by plotting the temperature dependence of the change of the bit line voltage with time against a logarithm of time.

As a result, the value of $V_0$ in the acceleration model equation can be accurately determined based on the measurement result of the temperature dependence of the bit line voltage with time.

Preferably, a value of $R_0$ in the acceleration model equation is determined from a gradient of a regression line that is obtained by plotting gradients of regression lines at a plurality of temperatures against values of $[A(T_C-T)]^{1/2}$ at the plurality of temperatures, respectively (where $T_C$ is a Curie temperature and $A$ is a constant), and the regression lines at the plurality of temperatures are obtained by plotting the temperature dependence of the change of the bit line voltage with time against a logarithm of time.

As a result, the value of $R_0$ in the acceleration model equation can be accurately determined based on the measurement result of the temperature dependence of the change of the bit line voltage with time.

Preferably, respective values of $T_C$ and A which are required to determine $V_0$ and $R_0$ of the acceleration model equation are determined from a gradient and an intercept of a regression line that is obtained by plotting, against temperature, a square of polarization $P_{SS}$ that is retained in the ferroelectric capacitor when data is written to the ferroelectric memory device.

As a result, the respective values of $T_C$ and A which are required to determine the values of $V_0$ and $R_0$ in the acceleration model equation can be accurately determined.

BRIEF DESCRIPTION OF THE DRAWINGS

FIG. 1 is a flowchart showing steps of a reliability test method for a ferroelectric memory device according to an embodiment of the present invention;

FIG. 16 is a flowchart showing measurement of retained polarization in a reliability test method for a ferroelectric memory device according to an embodiment of the present invention;

DETAILED DESCRIPTION OF THE INVENTION

Hereinafter, a method for testing retention characteristics of a ferroelectric memory device according to an embodiment of the present invention will be described with reference to the accompanying drawings.

FIG. 1 is a flowchart of a method for testing retention characteristics of ferroelectric memory devices. This test is conducted to evaluate whether or not the retention characteristics are guaranteed for guarantee time $t_1$ at guaranteed temperature $T_1$.

In a data writing step S100, data of one direction is written to a ferroelectric memory device.

In a high-temperature storing step S200, the ferroelectric memory device is stored for prescribed test time $t_2$ at an acceleration temperature $T_2$. The acceleration temperature $T_2$ is higher than the guarantee temperature $T_1$.

The prescribed test time $t_2$ is determined in a test-time determining step S300 based on temperature dependence of change with time of a bit line voltage that is generated when the data written to the ferroelectric memory device is read.

Whether data can be read from the ferroelectric memory device or not is examined in a reading examining step S400 and the test is completed. When the data can be read, it can be evaluated that the retention characteristics are guaranteed for the guarantee time $t_1$ at the guarantee temperature $T_1$. On the other hand, when the data cannot be read (read failure), it can be evaluated that the retention characteristics are not guaranteed for the guarantee time $t_1$ at the guarantee temperature $T_1$.

A reliability test method for a ferroelectric memory device according to an embodiment of the present invention is characterized in that test time $t_2$ is determined in the test-time determining step S300 based on temperature dependence of change with time of a bit line voltage that is generated when data written to the ferroelectric memory device is read.

Hereinafter, operation of reading data from a ferroelectric memory device and a bit line voltage generated in the read operation will be described with reference to the drawings.

Figure 2A:
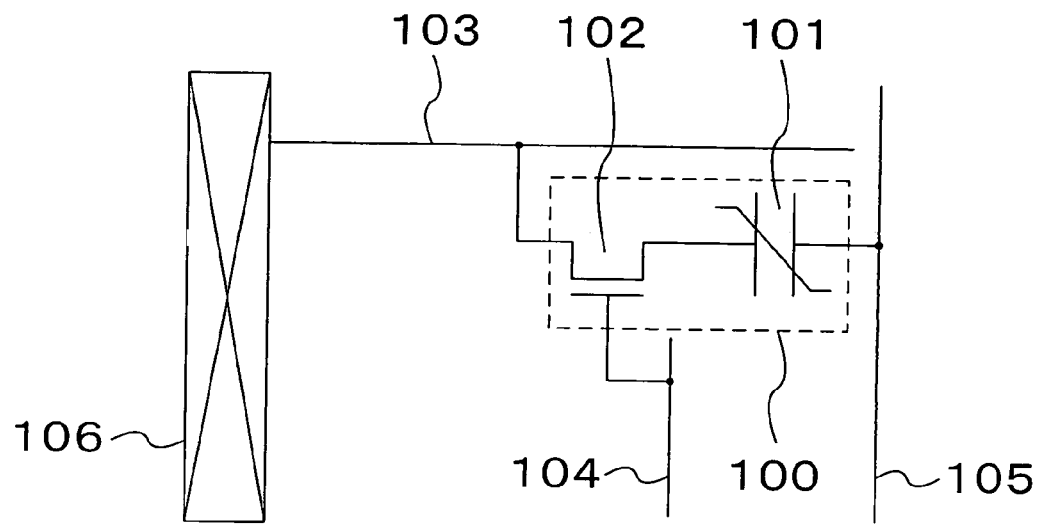
FIG. 2A shows the structure of a ferroelectric memory device.

FIG. 2A shows the structure of a ferroelectric memory device.

As shown in FIG. 2A, a basic unit of the ferroelectric memory device is a memory cell 100. The memory cell 100 includes a ferroelectric capacitor 101 and a MOS (Metal Oxide Semiconductor) transistor 102. The MOS transistor 102 functions as a transfer gate for access to the ferroelectric capacitor 101. A bit line 103 is connected to the source (or drain) of the MOS transistor 102, and a sense amplifier 106 is connected to an end of the bit line 103. A word line 104 is connected to the gate of the MOS transistor 102, and a plate line 105 is connected to the ferroelectric capacitor 101.

Figure 3A:
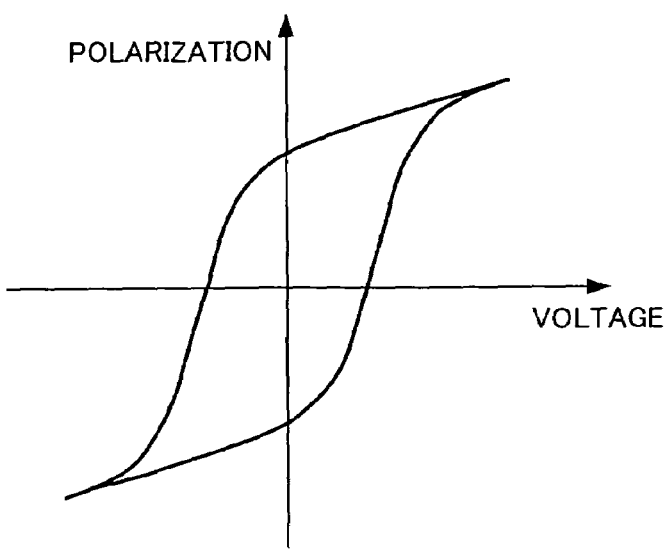
FIGS. 3A, 3B, and 3C show a polarization-voltage hysteresis curve of a ferroelectric capacitor and a polarization retention state.
Figure 3B:
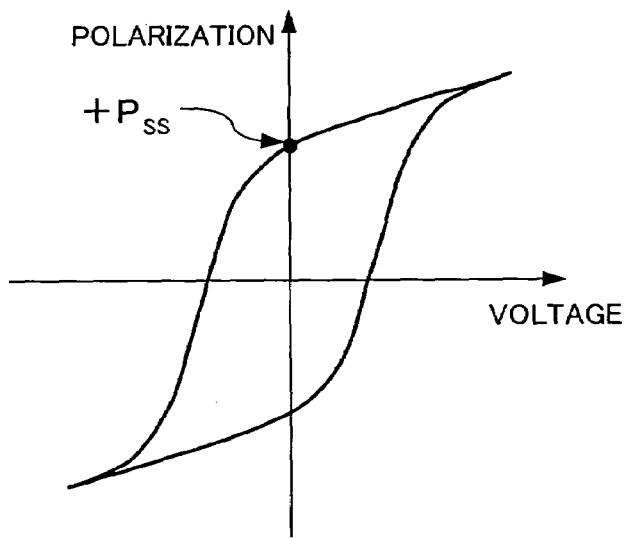
Figure 3C:
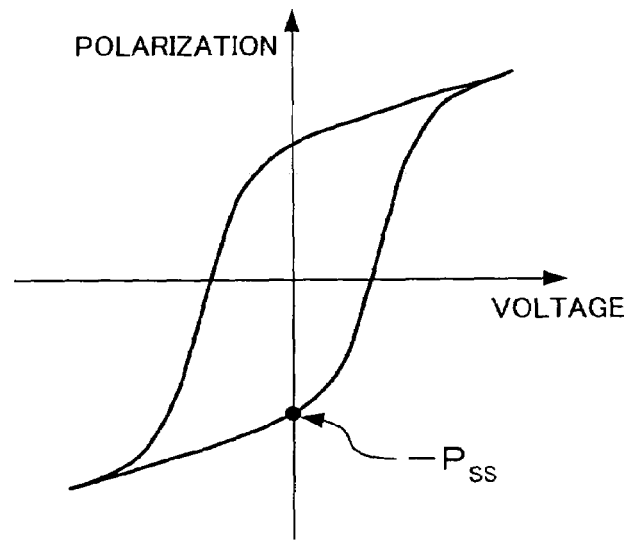

The ferroelectric capacitor 101 has a property that its polarization state changes according to an applied voltage. The relation between an applied voltage and polarization is represented by a polarization-voltage hysteresis curve as shown in FIG. 3A. When a positive voltage is applied to the ferroelectric capacitor 101 and then the voltage is reduced to zero, polarization of the positive direction remains and corresponding polarization $+P_{SS}$ is retained as shown in FIG. 3B. On the other hand, when a negative voltage is applied to the ferroelectric capacitor 101 and then the voltage is increased to zero, polarization of the negative direction remains and corresponding polarization $-P_{SS}$ is retained as shown in FIG. 3C. The ferroelectric memory device is a memory that stores polarization of the opposite directions retained in the ferroelectric capacitor 101 as "0" and "1," respectively (for convenience, it is herein assumed that data "0" corresponds to retained polarization $+P_{SS}$ and data "1" corresponds to retained polarization $-P_{SS}$.)

Figure 4A:
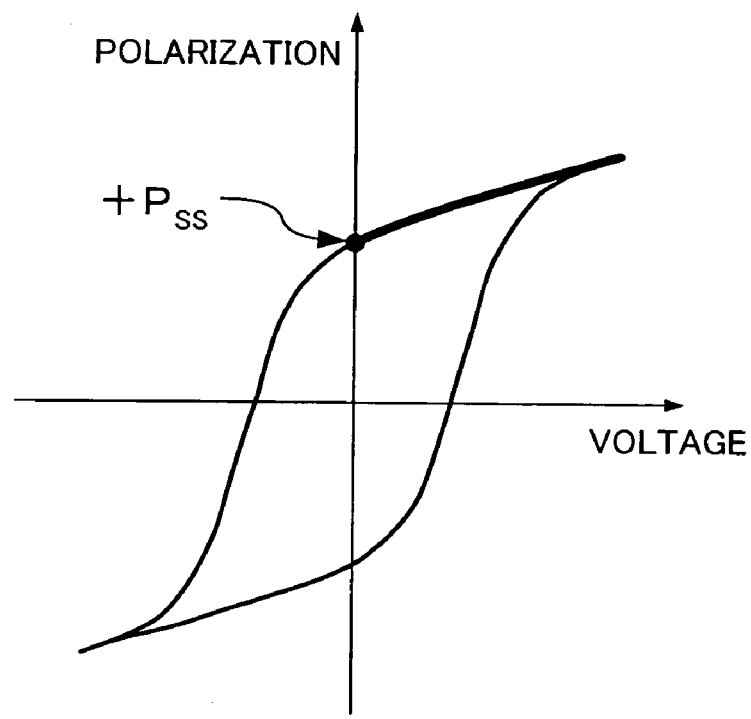
FIGS. 4A and 4B show a polarization-voltage hysteresis curve which is obtained when data written to a ferroelectric memory device is read.
Figure 4B:
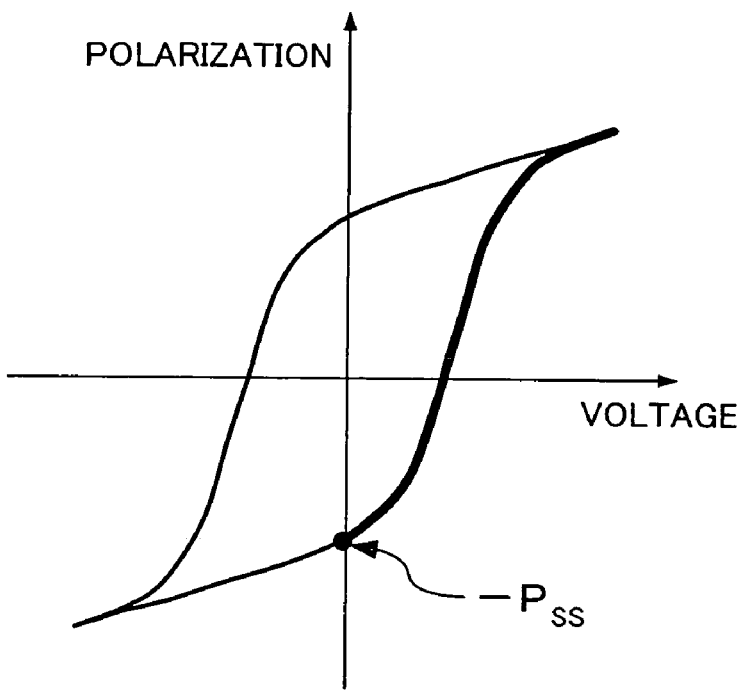

In order to read data stored in the ferroelectric memory device, a voltage of the bit line 103 is first set to zero, and the bit line 103 is then rendered in a floating state. Thereafter, a prescribed voltage is applied to the word line 104 to turn ON the MOS transistor 102, and a voltage $+V_{CC}$ is applied to the plate line 105. When the data retained in the ferroelectric memory device is "0," that is, when the ferroelectric capacitor 101 retains charges of polarization $+P_{SS}$, the polarization state of the ferroelectric capacitor 101 changes from the retained polarization $+P_{SS}$ according to a polarization-voltage hysteresis curve shown by the thick line in FIG. 4A. When the data retained in the ferroelectric memory device is "1," that is, when the ferroelectric capacitor 101 retains charges of polarization $-P_{SS}$, the polarization state of the ferroelectric capacitor 101 changes from the retained polarization $-P_{SS}$ according to a polarization-voltage hysteresis curve shown by the thick line in FIG. 4B. As the polarization state of the ferroelectric capacitor 101 changes, polarization charges retained in the ferroelectric capacitor 101 are discharged to the bit line 103 through the MOS transistor 102 as a transfer gate. The bit line 103 functions as a capacitor having a certain amount of bit line capacitance $C_B$. Therefore, a bit line voltage $V_B$ is generated as the discharged polarization charges are accumulated in the bit line 103.

Figure 2B:
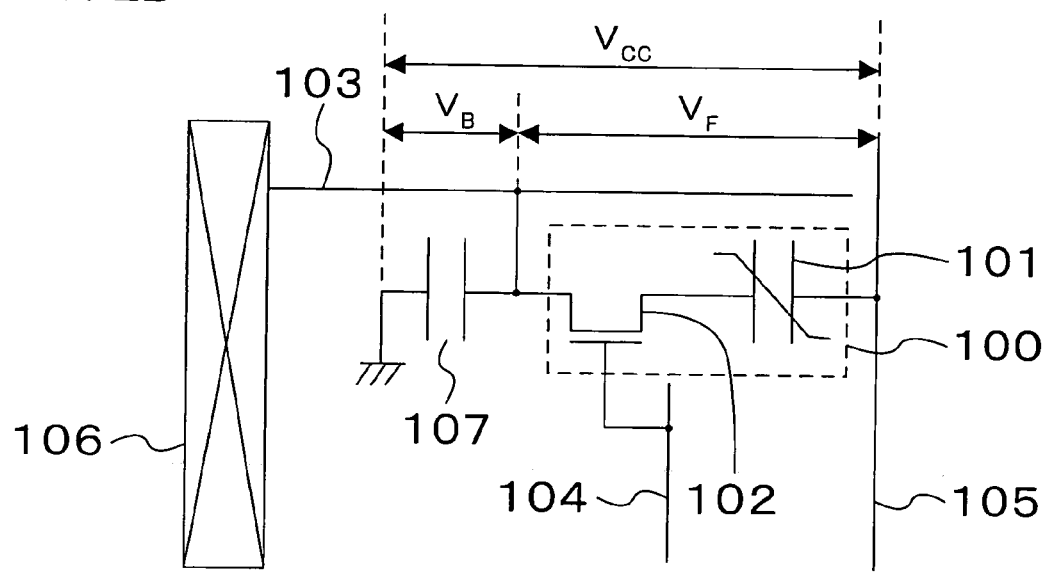
FIG. 2B shows the voltage relation in read operation of the ferroelectric memory device.

As shown in FIG. 2B, the voltage $V_{CC}$ applied to the plate line 105 is serially divided into a bit line voltage $V_B$ that is generated in the bit line 103 and a voltage $V_F$ that is applied to the ferroelectric capacitor 101. Therefore, the voltage $V_{CC}$ is shown by the following equation (1):

$$V_{CC} = V_B + V_F \quad (1).$$

(Note that a bit line capacitor 107 is added in FIG. 2B.) The amount of polarization charges $Q_F$ discharged from the ferroelectric capacitor 101 corresponds to change in the polarization state in response to the applied voltage $V_F$. Therefore, provided that P(V) is the polarization-voltage hysteresis curve in the read operation shown by the thick line in FIG. 4A or 4B (the retained polarization P is a function of the voltage V), the amount of polarization charges $Q_F$ is shown by the following equation (2):

$$Q_F = P(V_F) \quad (2).$$

On the other hand, the amount of polarization charges $Q_B$ accumulated in the bit line 103 is shown by the following equation (3):

$$Q_B = C_B V_B \quad (3).$$

According to the principle of conservation of charge, the amount of charges $Q_F$ discharged from the ferroelectric capacitor 101 is equal to the amount of charges $Q_B$ accumulated in the bit line 103. Therefore, the equation (4) is obtained:

$$Q_F = Q_B \quad (4)$$

The following equation (5) can be obtained from the equations (1) to (4):

$$P(V_F) = C_B(V_{CC} - V_F) \quad (5).$$

The equation (5) means that, in the above read operation, the voltage $V_F$ that is applied to the ferroelectric capacitor 101 is determined as the intersection of a polarization-voltage hysteresis curve shown by the following equation (6) and a bit line capacitance load line shown by the following equation (7):

$$Q = P(V) \quad (6)$$

$$Q = C_B(V_{CC} - V) \quad (7).$$

Figure 5A:
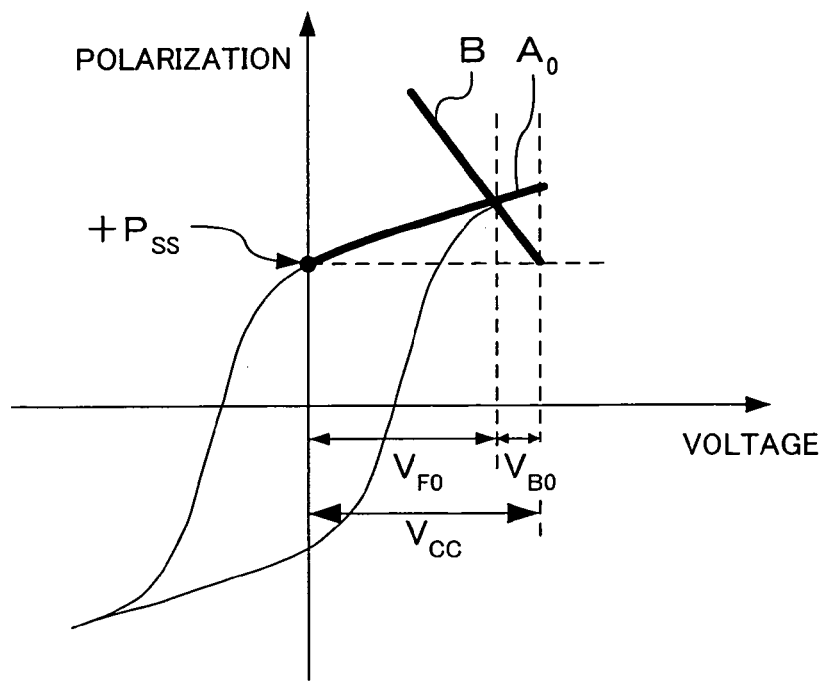
FIGS. 5A and 5B show that a bit line voltage is determined from the intersection of a polarization-voltage hysteresis curve of read operation and a bit line capacitance load line.
Figure 5B:
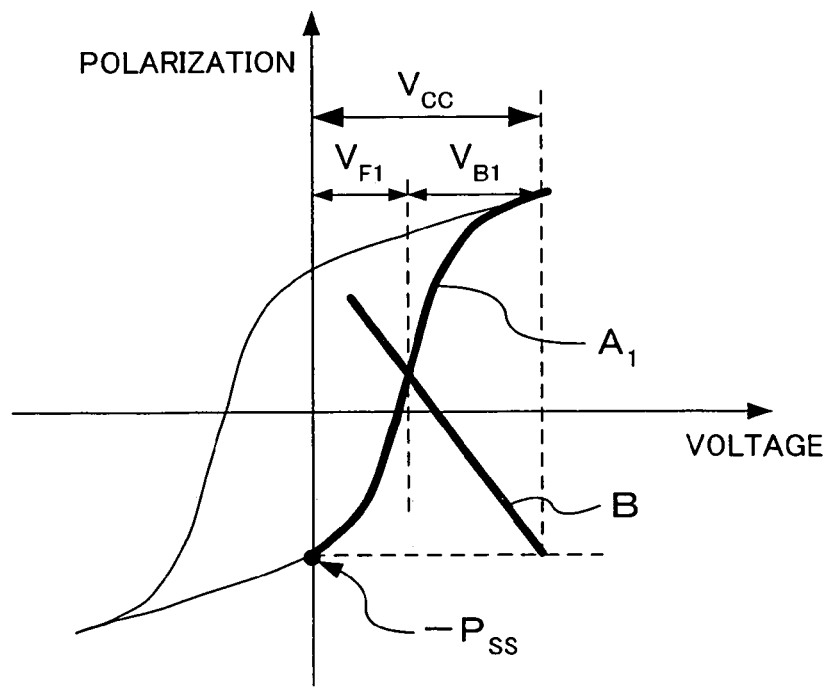

The fact that the voltage $V_F$ that is applied to the ferroelectric capacitor 101 in read operation is determined as the intersection of the equations (6) and (7) is shown in FIGS. 5A and 5B. FIG. 5A shows the case where data "0" is read, and FIG. 5B shows the case where data "1" is read.

As shown in FIG. 5A, when data "0" is read, a voltage $V_{F0}$ that is applied to the ferroelectric capacitor 101 is determined as the intersection of a polarization-voltage hysteresis curve $A_0$ that shows change in the polarization state from the polarization $+P_{SS}$ and a bit line capacitance load line B shown by the equation (7). A bit line voltage $V_{B0}$ shown in FIG. 5A is generated according to the following equation (8) obtained from the equation (1):

$$V_B = V_{CC} - V_F \quad (8)$$

As shown in FIG. 5B, when data "1" is read, a voltage $V_{F1}$ that is applied to the ferroelectric capacitor 101 is determined as the intersection of a polarization-voltage hysteresis curve $A_1$ that shows change in the polarization state from the polarization $-P_{SS}$ and the bit line capacitance load line B. A bit line voltage $V_{B1}$ is thus generated.

The bit line voltage $V_B$ thus generated is applied to the sense amplifier 106. The sense amplifier 106 detects the difference between the bit line voltage $V_B$ and a fixed reference voltage $V_R$, and determines whether the read data is "0" or "1" according to the relation between the bit line voltage $V_B$ and the reference voltage $V_R$.

Figure 6A:
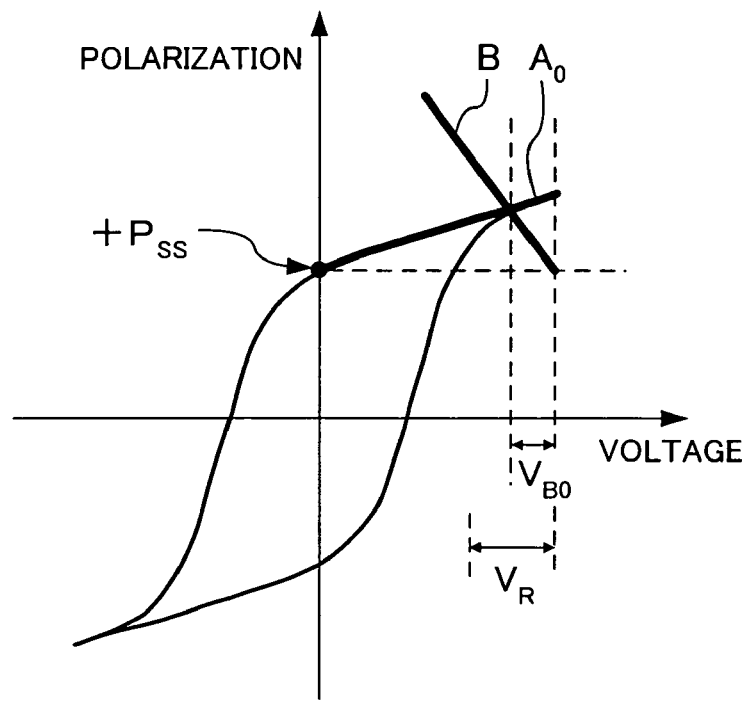
FIGS. 6A and 6B show the relation between a bit line voltage and a reference voltage.
Figure 6B:
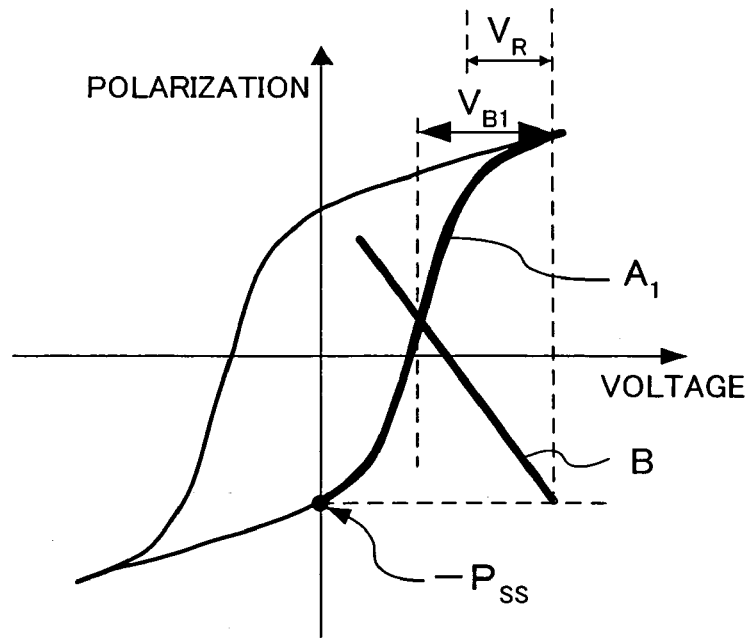

As shown in FIGS. 6A and 6B, the reference voltage $V_R$ is set to a value between the bit line voltages $V_{B0}$ and $V_{B1}$. When read data is "0," the relation between the bit line voltage $V_B$ and the reference voltage $V_R$ is $V_{B0} < V_R$ as shown in FIG. 6A. On the other hand, when read data is "1," the relation between the bit line voltage $V_B$ and the reference voltage $V_R$ is $V_{B1} > V_R$ as shown in FIG. 6B. In this way, the relation between the bit line voltage and the reference voltage is reversed depending on the data direction. The sense amplifier 106 can thus determine whether the read data is "0" or "1."

If the bit line voltage $V_{B0}$ or $V_{B1}$ changes and the relation becomes $V_{B0} > V_R$ or $V_{B1} < V_R$ while the data written to the ferroelectric memory device is stored, data "0" is read as "1" and data "1" is read as "0." In other words, read failure, i.e., retention failure, occurs.

Hereinafter, how the bit line voltage $V_B$ changes with time while the data written to the ferroelectric memory device is stored will be described.

As described above, the bit line voltage $V_B$ is determined as the intersection of the polarization-voltage hysteresis curve for read operation and the bit line capacitance load line. The bit line capacitance load line does not change unless the bit line capacitance $C_B$ changes. The bit line capacitance $C_B$ does not change while the data written to the ferroelectric memory device is stored. Therefore, change of the bit line voltage $V_B$ is determined by change of the polarization-voltage hysteresis curve for read operation. Accordingly, change of the bit line voltage $V_B$ with time is determined by how the polarization-voltage hysteresis curve of the ferroelectric capacitor changes.

Figure 7A:
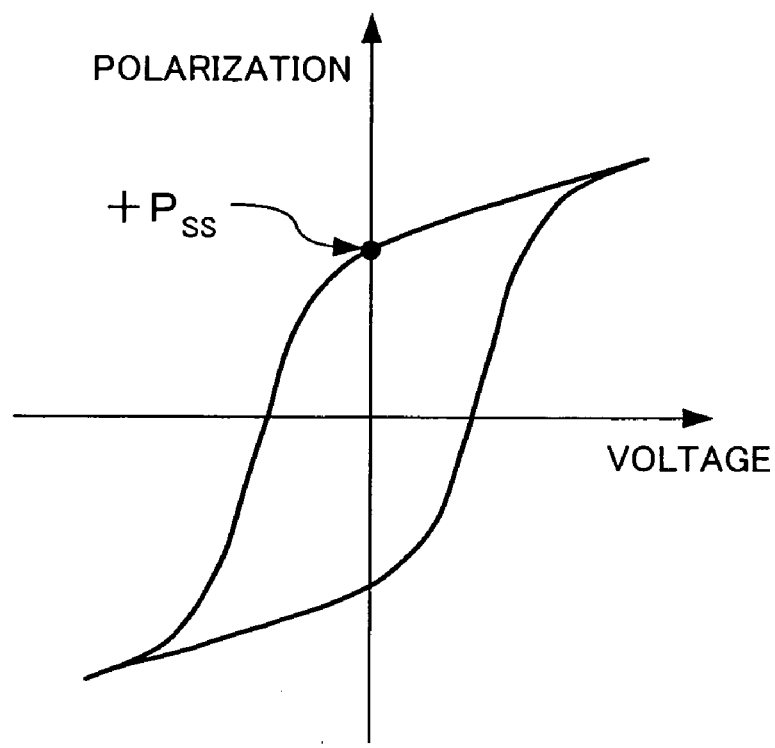
FIGS. 7A and 7B show change of a polarization-voltage hysteresis curve of a ferroelectric capacitor which is observed when data is written to a ferroelectric memory device and stored therein.
Figure 7B:
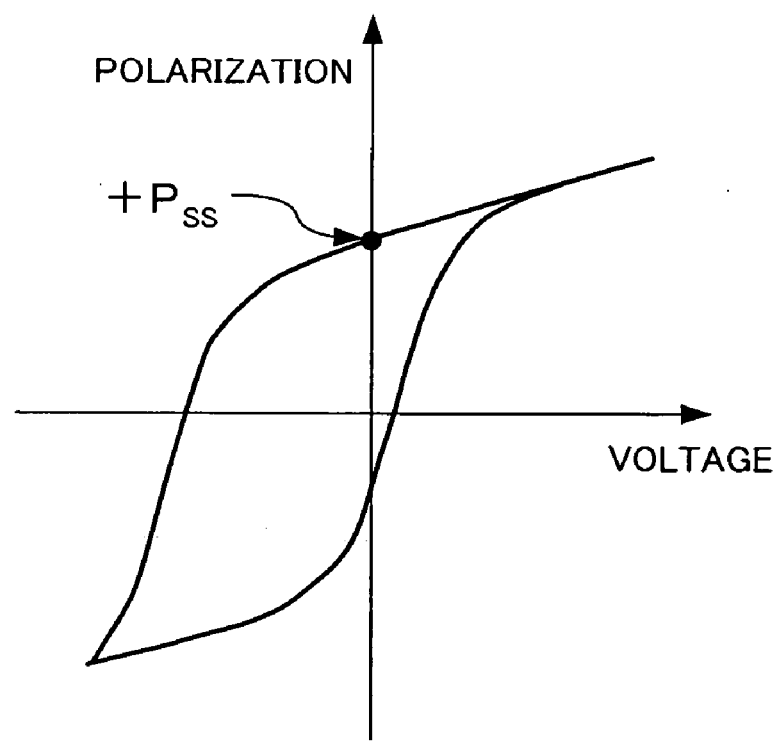

FIGS. 7A and 7B show how the polarization-voltage hysteresis curve of the ferroelectric capacitor changes when data "0" is written to the ferroelectric memory device and stored therein.

FIG. 7A shows an initial state at the time the data storage is started. The ferroelectric capacitor retains polarization $+P_{SS}$ corresponding to data "0" according to the polarization-voltage hysteresis curve of the initial state.

FIG. 7B shows the state after the data is stored for a certain period of time. In this state, the hysteresis curve has been significantly affected by the imprint characteristics. As described above, the imprint characteristics are characteristics that when the ferroelectric capacitor retains polarization of one direction, the polarization of that direction retained therein is stabilized. The stabilizing effect is overwhelmingly stronger than the depolarizing effect. Therefore, the value of the retained polarization $+P_{SS}$ does not change from the initial value. As is well known in the art, however, the imprint characteristics shift the hysteresis curve in the voltage axis direction. The direction in which the hysteresis curve is shifted is determined by the direction of the retained polarization. In the case of the polarization $+P_{SS}$ of the positive direction, the hysteresis curve is shifted in the negative direction as shown in FIG. 7B.

Figure 8A:
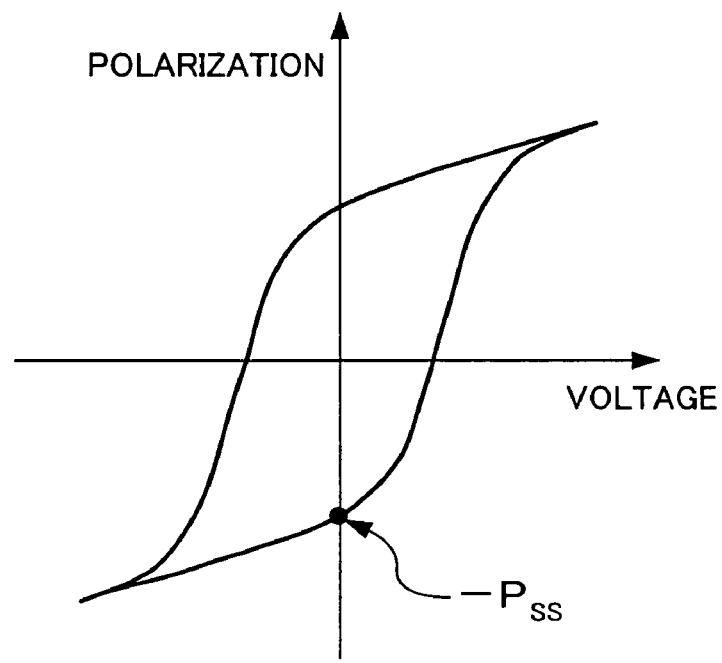
FIGS. 8A and 8B show change of a polarization-voltage hysteresis curve of a ferroelectric capacitor which is observed when data is written to a ferroelectric memory device and stored therein.
Figure 8B:
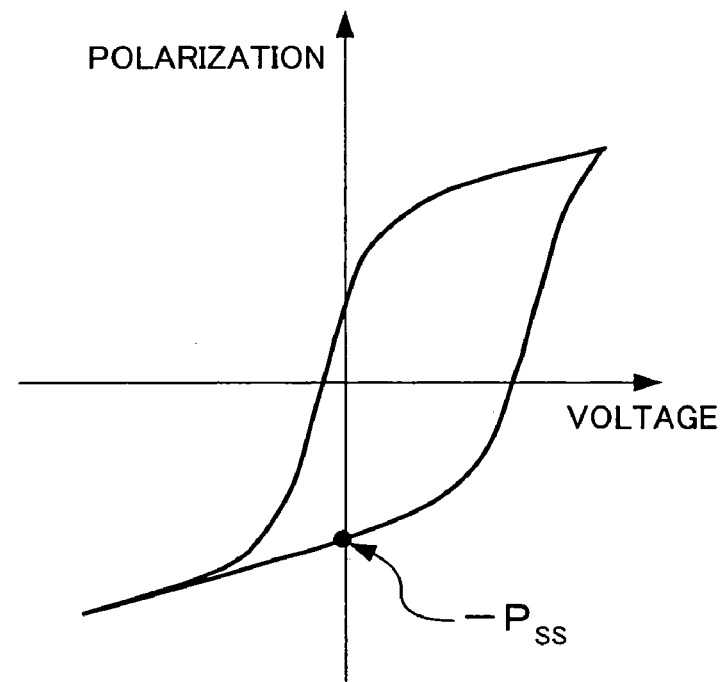

FIGS. 8A and 8B show how the polarization-voltage hysteresis curve of the ferroelectric capacitor changes when data "1" is written to the ferroelectric memory device and stored therein.

FIG. 8A shows an initial state at the time the data storage is started. The ferroelectric capacitor retains polarization $-P_{SS}$ corresponding to data "1" according to the polarization-voltage hysteresis curve of the initial state.

FIG. 8B shows the state after the data is stored for a certain period of time. As in FIG. 7B, due to the stabilizing effect of the imprint characteristics, the value of the retained polarization $-P_{SS}$ does not change from the initial value, but the hysteresis curve is shifted in the voltage axis direction. In the case of the polarization $-P_{SS}$ of the negative direction, the hysteresis curve is shifted in the positive direction as shown in FIG. 8B.

Change of the bit line voltage with time will be described in terms of the read operation at the time the data storage is started (the initial state) and the read operation after the data is stored for a certain period of time as described in FIGS. 7A, 7B and FIGS. 8A, 8B.

First, operation of reading data "0" from the ferroelectric memory device will be described with reference to FIGS. 9A to 9D.

Figures 9A, 9B:
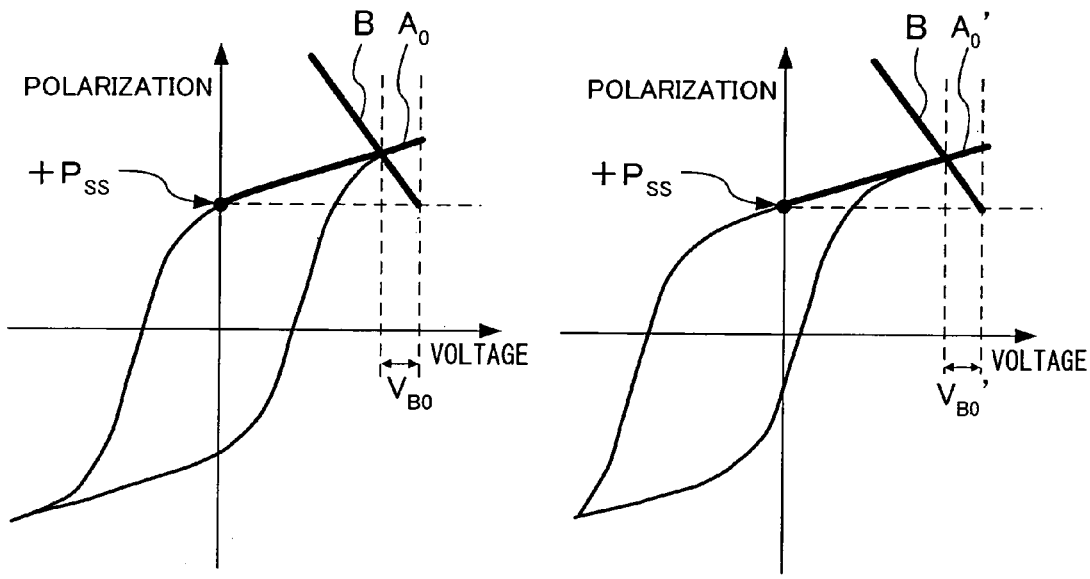
FIGS. 9A, 9B, and 9C, and 9D show change of retained polarization and change of a bit line voltage which are observed when data is written to a ferroelectric memory device and stored therein.

FIG. 9A shows the read operation in the initial state of data "0" shown in FIG. 7A.

As shown in FIG. 9A, a bit line voltage $V_{B0}$ that is generated by reading the data "0" is determined as shown in the figure based on the intersection of the hysteresis curve $A_0$ starting from the retained polarization $+P_{SS}$ and the bit line capacitance load line B.

FIG. 9B shows the read operation after the data "0" is stored for a certain period of time as shown in FIG. 7B.

As shown in FIG. 9B, the hysteresis curve is shifted with time in the negative voltage direction to a hysteresis curve $A_0'$ due to the imprint characteristics. Therefore, a bit line voltage $V_{B0}'$ is determined as shown in FIG. 9B based on the intersection of the hysteresis curve $A_0'$ and the bit line capacitance load line B.

Figure 9C:
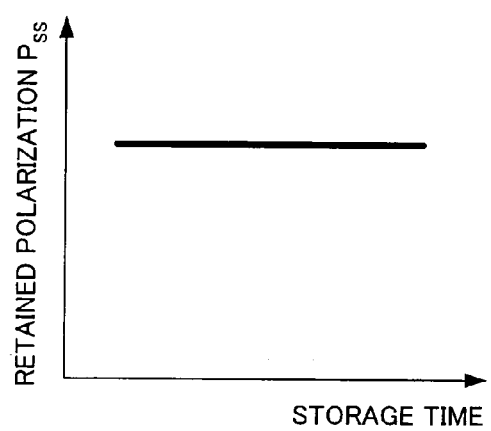
Figure 9D:
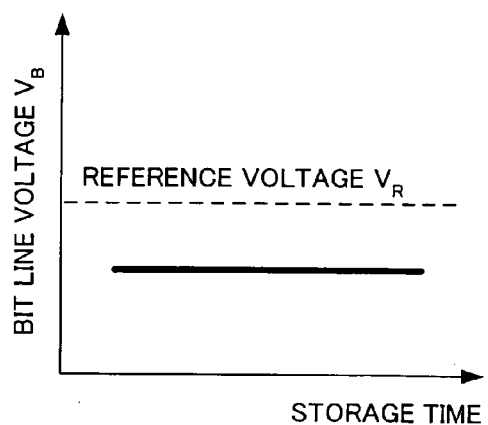

The value of the retained polarization $P_{SS}$ does not change between FIGS. 9A and 9B due to the stabilizing effect of the imprint characteristics. In other words, the retained polarization $P_{SS}$ does not change with time as shown in FIG. 9C. Although the hysteresis curve is shifted in the negative voltage direction due to the imprint characteristics, data "0" is read without inversion of the polarization direction. Therefore, the hysteresis curve $A_0'$ after a certain period of time is approximately the same as the hysteresis curve $A_0$ in the initial state. Accordingly, the bit line voltage $V_B$ does not change with time as shown in FIG. 9D. As a result, when data "0" is written to the ferroelectric memory device, the bit line voltage $V_B$ does not exceed the reference voltage $V_R$ with time as shown in FIG. 9D. Therefore, read failure cannot occur.

Figure 10A:
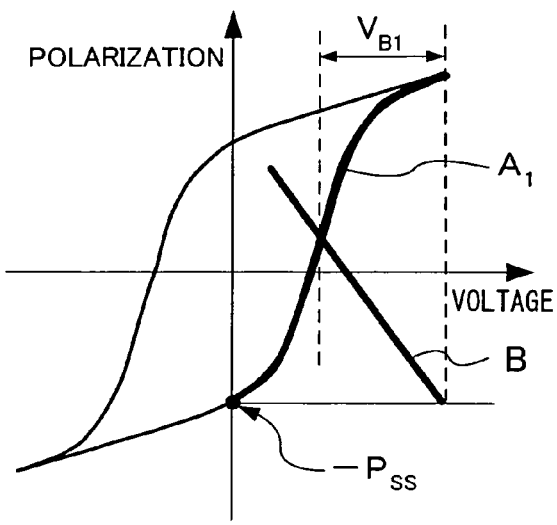
FIGS. 10A, 10B, 10C, and 10D show change of retained polarization and change of a bit line voltage which are observed when data is written to a ferroelectric memory device and stored therein.
Figure 10B:
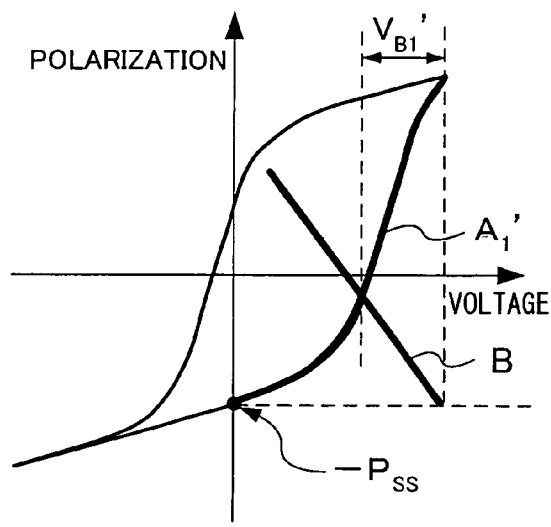
Figure 10C:
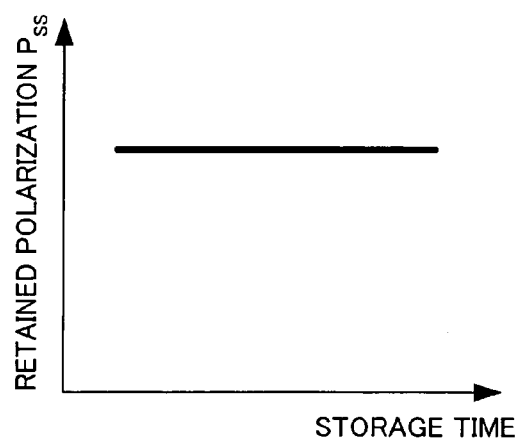
Figure 10D:
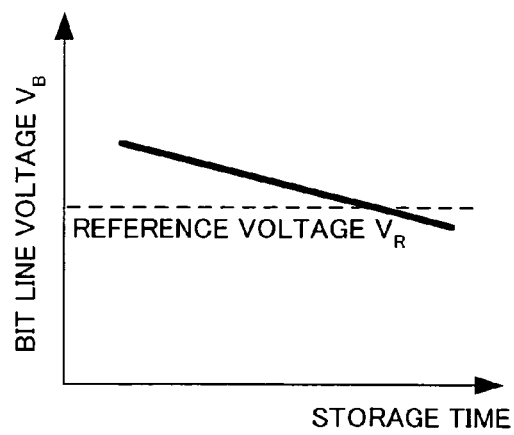

As shown in FIGS. 10D to 10D, however, the condition of the case where data "1" is written to the ferroelectric memory device is significantly different from that of the case where data "0" is written thereto.

FIG. 10A shows the read operation in the initial state of data "1" shown in FIG. 8A.

As shown in FIG. 10A, a bit line voltage $V_{B1}$ that is generated by reading the data "1" is determined as shown in the figure based on the intersection of the hysteresis curve $A_1$ starting from the retained polarization $-P_{SS}$ and the bit line capacitance load line B.

FIG. 10B shows the read operation after the data "1" is stored for a certain period of time as shown in FIG. 8B.

As shown in FIG. 10B, the hysteresis curve is shifted with time in the positive voltage direction to a hysteresis curve $A_1'$ due to the imprint characteristics. Therefore, a bit line voltage $V_{B1}'$ is determined as shown in FIG. 10B based on the intersection of the hysteresis curve $A_1'$ and the bit line capacitance load line B.

The value of the retained polarization $P_{SS}$ does not change between FIGS. 10A and 10B due to the stabilizing effect of the imprint characteristics. In other words, the retained polarization $P_{SS}$ does not change with time as shown in FIG. 10C. However, data "1" is read with inversion of the polarization direction, and the hysteresis curve is shifted in the positive voltage direction due to the imprint characteristics. Therefore, the hysteresis curve $A_0'$ after a certain period of time is located in the positive voltage direction with respect to the hysteresis curve $A_0$ in the initial state. The bit line voltage $V_B$ which is determined based on the intersection of the hysteresis curve and the bit line capacitance load line decreases with time. In other words, the bit line voltage $V_B$ changes with time as shown in FIG. 10D. Data "1" written to the ferroelectric memory device cannot be read when the bit line voltage $V_B$ becomes lower than the reference voltage $V_R$ as shown in FIG. 10D. Therefore, retention failure may occur.

As has been described above, retention failure may occur in the ferroelectric memory device when the retained polarization does not change with time and the bit line voltage decreases with time. Accordingly, it is appropriate to select a bit line voltage as a parameter and to measure change of the bit line voltage with time in the test-time determining step S300 of FIG. 1. If the retained polarization is selected as a parameter as in the conventional method, change with time of the parameter relating to the retention characteristics cannot be obtained even when retention failure may occur. As a result, the test time cannot be determined. By selecting the bit line voltage as a parameter, change with time of the parameter relating to the retention characteristics can be obtained, and the test time can be reliably determined.

Hereinafter, a specific method for determining the test time $t_2$ by selecting the bit line voltage as a parameter in the test-time determining step S300 will be described.

Figure 11:
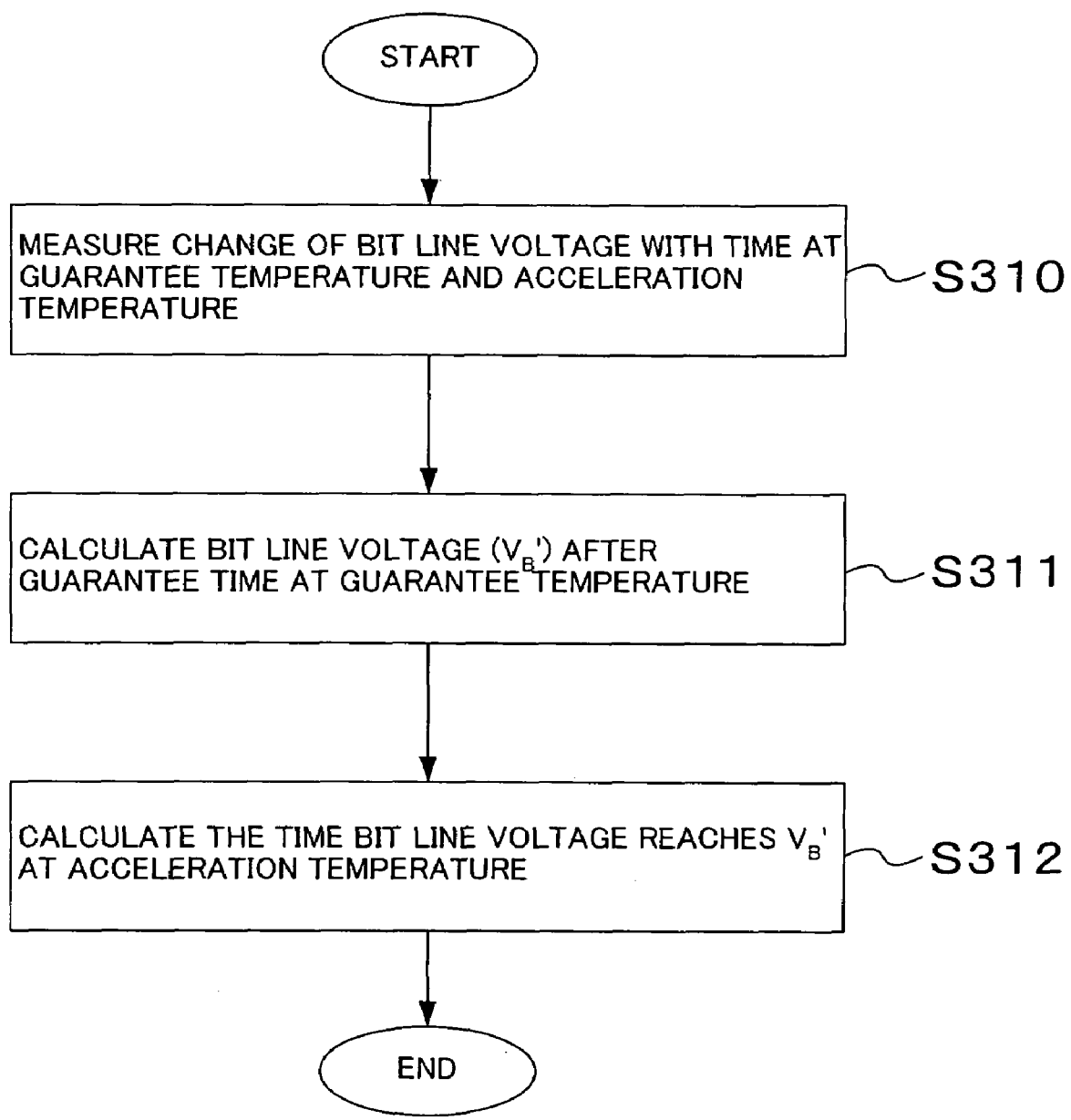
FIG. 11 is a flowchart showing the steps that are conducted in a test-time determining step in a reliability test method for a ferroelectric memory device according to an embodiment of the present invention.

FIG. 11 is a flowchart showing three steps of the test-time determining step S300.

In the first step S310, change with time of a bit line voltage that is generated when data written to the ferroelectric memory device is read is measured at the guarantee temperature $T_1$ and the acceleration temperature $T_2$.

In the second step S311, a bit line voltage $V_B'$ after the guarantee time $t_1$ at the guarantee temperature $T_1$ is calculated based on the change of the bit line voltage with time at the guarantee temperature $T_1$ which was measured in the first step S310.

In the third step S312, the time required for the bit line voltage to reach the value $V_B'$ at the acceleration temperature $T_2$ is calculated based on the change of the bit line voltage with time at the acceleration temperature $T_2$ which was measured in the first step S310. The time thus calculated is determined as test time $t_2$.

It is usually difficult to measure the bit line voltage in the first step S310 by using a ferroelectric memory device that is to be actually tested. In the read operation of the ferroelectric memory device, data is read by the bit line voltage, but only the data "0" or "1" is output to the outside and a specific bit line voltage value is not output.

In order to solve this problem, it is highly effective to graphically determine the bit line voltage. More specifically, an independent ferroelectric capacitor for evaluation (hereinafter, sometimes referred to as "independent evaluation ferroelectric capacitor") which has the same structure as that of a ferroelectric capacitor of the ferroelectric memory device to be actually tested is used to determine the bit line voltage ("independent" herein means that other elements such as transistors are not connected to the ferroelectric capacitor). A polarization-voltage hysteresis curve is obtained by reading retained polarization corresponding to the data written to the actual ferroelectric memory device from the independent evaluation ferroelectric capacitor. The bit line voltage is determined from the intersection of the measured polarization-voltage hysteresis curve and the bit line capacitance load line.

Figure 12:
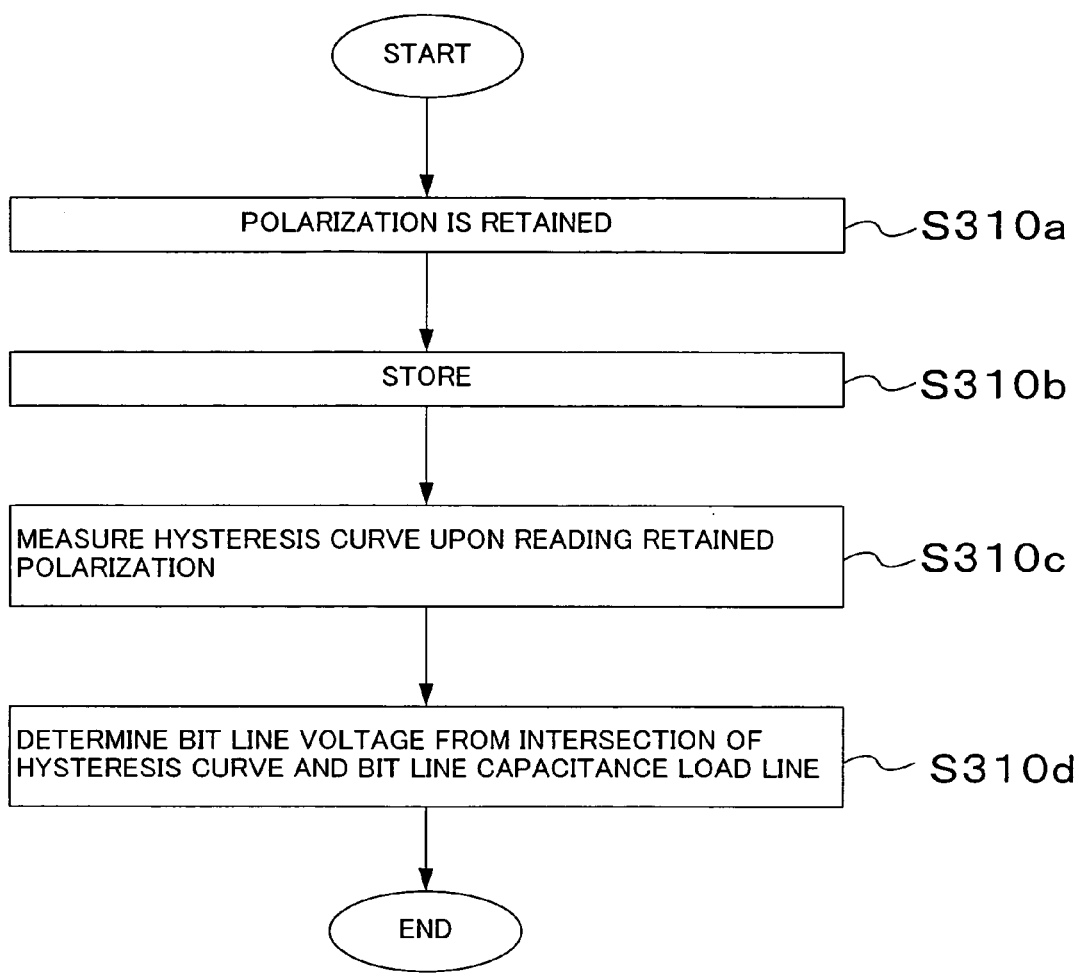
FIG. 12 is a flowchart showing measurement of a bit line voltage in a reliability test method for a ferroelectric memory device according to an embodiment of the present invention.

More specifically, as shown in FIG. 12, polarization of one direction is retained in the evaluation ferroelectric capacitor in the first step S310a.

In the second step S310b, the polarization of one direction is stored in the evaluation ferroelectric capacitor for a desired period of time at an intended temperature.

In the third step S310c, the retained polarization that has been stored for the desired period of time at the intended temperature is read, and a polarization-voltage hysteresis curve is measured. It should be noted that this read operation must be conducted in the direction having inversion of the polarization state (the inversion read direction). As described earlier with reference to FIGS. 9A to 9D and FIGS. 10A to 10D, retention failure occurs only in the inversion read direction. Change with time of the bit line voltage relating to the retention characteristics cannot be obtained unless the data is read in this direction.

In the fourth step S310d, the bit line voltage is graphically determined from the intersection of the measured polarization-voltage hysteresis curve and the bit line capacitance load line as described earlier in FIGS. 5A and 5B. By conducting the above process a plurality of times at various lengths of storage time, the first step S310 (measurement of the change of the bit line voltage with time) can be extremely easily realized.

By conducting the test-time determining step S300 by the above method, the bit line voltage selected as a parameter changes with time. Therefore, the time the bit line voltage at the acceleration temperature $T_2$ becomes equal to the bit line voltage at the guarantee time $t_1$ at the guarantee temperature $T_1$ can be obtained. The time thus obtained is determined as test time $t_2$ of the high-temperature storing step S200. By storing the data for the test time $t_2$ at the acceleration temperature $T_2$, the condition after the guarantee time $t_1$ at the guarantee temperature $T_1$ can be reproduced in a short period of time. In this way, the temperature acceleration test can be reliably conducted.

In this method, however, change of the bit line voltage with time is measured not only at the guarantee temperature $T_1$ but also at the acceleration temperature $T_2$ in the first step S310. Therefore, the acceleration temperature $T_2$ needs to be determined in advance. Accordingly, the acceleration temperature $T_2$ and the test time $t_2$ cannot be determined simultaneously.

In order to solve this problem, the inventor derived an acceleration model equation that describes the test time $t_2$ as a function of the acceleration temperature $T_2$, based on the following analysis:

The inventor found that change of the bit line voltage with time at a temperature T is shown by the following equation (9):

$$V_B(t, T) = V_B(t_0, T) - R(T) \cdot \ln[t/t_0] \qquad (9).$$

In the equation (9), $V_B(t, T)$ is a bit line voltage that is represented as a function of time t and temperature T. $V_B(t_0,$ T) is a bit line voltage at arbitrary time $t_0$ at temperature T. R(T) is a decreasing rate of the bit line voltage at temperature T.

As shown by the equation (9), change of the bit line voltage with time is linear with respect to the logarithm of time t.

The inventor also found that $V_B(t_0, T)$ and R(T) on the right-hand side of the equation (9) are shown by the following equations (10) and (11), respectively:

$$V_B(t_0, T) = V_0 \cdot P_{SS}(T) + V_1 \qquad (10)$$

$$R(T) = R_0 \cdot P_{SS}(T) \qquad (11).$$

In the equations (10) and (11), $P_{SS}(T)$ indicates the value of the retained polarization $P_{SS}$ at temperature T, and $V_0$, $V_1$, and $R_0$ are constants.

As shown by the equation (10), the bit line voltage $V_B(t_0, T)$ at arbitrary time to has a linear relation with the retained polarization $P_{SS}(T)$ at temperature T. As shown by the equation (11), the decreasing rate R(T) of the bit line voltage is proportional to the retained polarization $P_{SS}(T)$ at temperature T.

It is known that the retained polarization $P_{SS}(T)$ at temperature T is shown by the following equation (12) according to the Curie-Weiss law that shows a common property of ferroelectric capacitors:

$$P_{SS}(T) = [A(T_C - T)]^{1/2} \qquad (12).$$

In the equation (12), $T_C$ is a Curie temperature and A is a constant. Note that the Curie temperature is the temperature at which a ferroelectric material completely loses its retained polarization due to change in the crystal structure. The equation (12) indicates that the retained polarization $P_{SS}$ decreases with increase in the temperature T in the temperature region lower than the Curie temperature.

By substituting the equation (12) into the equations (10) and (11), temperature dependence of $V_B(t_0, T)$ and R(T) is shown by the following equations (13) and (14), respectively:

$$V_B(t_0, T) = V_0 \cdot [A(T_C - T)]^{1/2} + V_1 \qquad (13)$$

$$R(T) = R_0 \cdot [A(T_C - T)]^{1/2} \qquad (14).$$

By substituting the equations (13) and (14) into the equation (9), the following equation (15) is obtained as an equation indicating change of the bit line voltage with time and temperature dependence of the change of the bit line voltage with time:

$$V_B(t, T) = [A(T_C - T)]^{1/2} \cdot \{V_0 - R_0 \cdot \ln[t/t_0]\} + V_1 \qquad (15).$$

By using the equation (15), the equation indicating the test time $t_2$ at the acceleration temperature $T_2$ corresponding to the guarantee time $t_1$ at the guarantee temperature $T_1$ is derived as follows:

From the equation (15), the following equation (16) is obtained for the guarantee time $t_1$ and the guarantee temperature $T_1$:

$$V_B(t_1, T_1) = [A(T_C - T_1)]^{1/2} \cdot \{V_0 - R_0 \cdot \ln[t_1/t_0]\} + V_1 \qquad (16).$$

Similarly, the following equation (17) is obtained for the test time $t_2$ and the acceleration temperature $T_1$:

$$V_B(t_2, T_2) = [A(T_C - T_2)]^{1/2} \cdot \{V_0 - R_0 \cdot \ln[t_2/t_0]\} + V_1 \qquad (17).$$

When the storage time $t_2$ at the acceleration temperature $T_2$ corresponds to the guarantee time $t_1$ at the guarantee temperature $T_1$, the following equation (18) is obtained:

$$V_B(t_1, T_1) = V_B(t_2, T_2) \qquad (18).$$

Therefore, the following equation (19) is obtained from the equations (16) to (18):

$$[A(T_C - T_1)]^{1/2} \cdot \{V_0 - R_0 \cdot \ln[t_1/t_0]\} + V_1 = \qquad (19)$$
$$[A(T_C - T_2)]^{1/2} \cdot \{V_0 - R_0 \cdot \ln[t_2/t_0]\} + V_1.$$

By solving the equation (19) for $\ln[t_2]$, the following equation (20) is obtained:

$$\ln[t_2] = [(T_C - T_1)/(T_C - T_2)]^{1/2} \cdot \ln[t_1] + \qquad (20)$$
$$\{1 - [(T_C - T_1)/(T_C - T_2)]^{1/2}\} \cdot (V_0/R_0 + \ln[t_0]).$$

In the equation (10), the constant $V_0$ on the right-hand side of the equation (20) is defined as a constant corresponding to the bit line voltage $V_B(t_0, T)$ at arbitrary time $t_0$. Therefore, provided that $t_0$ is unit time, that is, $t_0 = 1$, $V_0$ can be redefined for the bit line voltage $V_B(1, T)$ at the unit time, as shown by the following equation (21):

$$V_B(1, T) = V_0 \cdot P_{SS}(T) \qquad (21).$$

Accordingly, the equation (20) applies to the case of $t_0 = 1$. Therefore, the following equation (22) is finally derived:

$$\ln[t_2] = [(T_C - T_1)/(T_C - T_2)]^{1/2} \cdot \ln[t_1] + \qquad (22)$$
$$\{1 - [(T_C - T_1)/(T_C - T_2)]^{1/2}\} \cdot (V_0/R_0).$$

The equation (22) is an acceleration model equation that describes the test time $t_2$ as a function of the acceleration temperature $T_2$.

Since test time $t_2$ at an arbitrary acceleration temperature $T_2$ can be determined from the equation (22), the acceleration temperature $T_2$ and the test time $t_2$ can be determined simultaneously. It should be noted that, in order to determine the test time $t_2$ from the equation (22), it is necessary to determine in advance the Curie temperature $T_C$ and the constants $V_0$ and $R_0$ which are acceleration parameters.

Figure 13:
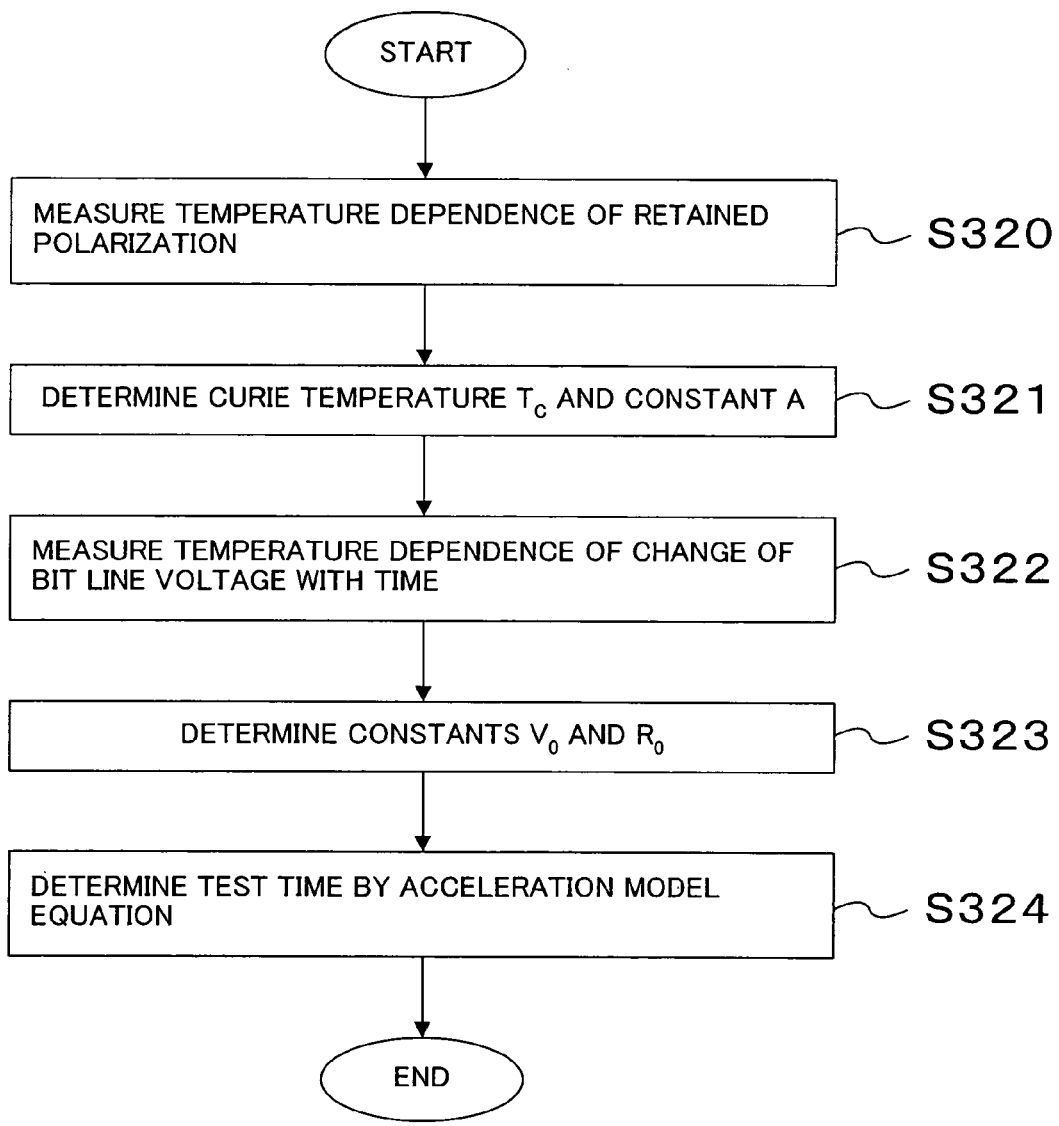
FIG. 13 is a flowchart showing the steps that are conducted in a test-time determining step in a reliability test method for a ferroelectric memory device according to an embodiment of the present invention.

FIG. 13 is a flowchart showing five steps of determining these acceleration parameters and determining the test time $t_2$ in the test-time determining step S300.

As shown in FIG. 13, temperature dependence of polarization $P_{SS}$ that is retained in the ferroelectric capacitor when data is written to the ferroelectric memory device is measured in the first step S320.

In the second step S321, the Curie temperature $T_C$ and the constant A are determined by using the measured temperature dependence of the retained polarization $P_{SS}$.

More specifically, the square of the retained polarization $P_{SS}$ at each temperature is plotted against the temperature (absolute temperature), and the gradient a and the intercept b of the approximated line are obtained.

Based on the equation (12), the Curie temperature $T_C$ and the constant A are determined as shown by the following equations (23) and (24):

$$T_C = -b/a \qquad (23)$$

$$A = -a \qquad (24).$$

Temperature dependence of change with time of the bit line voltage that is generated when data written to the ferroelectric memory device is read is measured in the third step S322.

In the fourth step S323, the constants $V_0$ and $R_0$ are determined based on the measured temperature dependence of the change of the bit line voltage with time.

More specifically, change of the bit line voltage with time at each temperature is plotted against the logarithm of time t, and the intercept c and the gradient d of the approximated line shown by the following equation (25) are obtained:

$$V_B = c - d \cdot \ln[t] \tag{25}$$

It can be seen from the equations (9) and (25) that the value c is the bit line voltage $V_B(1, T)$ at the time the arbitrary time $t_0$ in the equation (9) is unit time, that is, $t_0=1$. The value d is the decreasing rate $R(T)$ of the bit line voltage at each temperature. Accordingly, the following equations (26) and (27) are obtained from the equations (13) and (14):

$$c = V_0 \cdot [A(T_C - T)]^{1/2} + V_1 \tag{26}$$

$$d = R_0 \cdot [A(T_C - T)]^{1/2} \tag{27}$$

By plotting the values c and d of each temperature against $[A(T_C - T)]^{1/2}$ of each temperature, the gradients of the respective regression lines can be determined as the constants $V_0$ and $R_0$, respectively.

In the fifth step S324, test time $t_2$ is determined by substituting the respective values of the acceleration parameters $T_C$, $V_0$, and $R_0$ thus obtained and the respective values of the guarantee temperature $T_1$, the acceleration temperature $T_2$, and the guarantee time $t_1$ into the acceleration model equation (22).

Preferably, measurement of the bit line voltage in the third step S322 is conducted by the same steps as the steps S310a to S310d in FIG. 12 by using an independent evaluation ferroelectric capacitor having the same structure as that of the ferroelectric capacitor of the ferroelectric memory device. Similarly, measurement of the retained polarization in the first step S320 is preferably conducted by using the evaluation ferroelectric capacitor because it is difficult to measure the retained polarization by using a ferroelectric memory device that is to be actually tested.

By conducting the test-time determining step S300 as described above, test time $t_2$ at an arbitrary acceleration temperature $T_2$ can be determined without determining the acceleration temperature $T_2$ in advance. As a result, an appropriate acceleration temperature $T_2$ and corresponding test time $t_2$ can be determined simultaneously. By conducting the high-temperature storing step S200 by using the acceleration temperature $T_2$ and the test time $t_2$ thus determined, the condition after the guarantee time $t_1$ at the guarantee temperature $T_1$ can be reproduced in a short-period of time, and the acceleration test can be reliably conducted.

FIRST EXAMPLE

A first example of the method for testing retention characteristics of a ferroelectric memory device according to an embodiment of the present invention will be described with reference to the accompanying drawings.

In this example, the retention characteristic test of the ferroelectric memory device is conducted at an acceleration temperature of 125° C. in order to evaluate whether or not the retention characteristics can be guaranteed for guarantee time of 10 years at a guarantee temperature of 85° C.

The retention characteristic test of the ferroelectric memory device in this example was conducted according to the flowchart of FIG. 1.

First, in the data writing step S100, data of one direction was written to the ferroelectric memory device. Note that the data was written to the ferroelectric memory device by applying a unipolar voltage pulse of 1.8 V to a ferroelectric capacitor of the ferroelectric memory device. The data was written in such a direction that the data is read with inversion of the polarization direction of the ferroelectric capacitor (the direction in which retention failure may occur).

In the high-temperature storing step S200, the ferroelectric memory device was stored for nine hours at 125° C. The storage time of the high-temperature storing step S200 was determined as follows according to the flowchart of the test-time determining step S300 in FIG. 11:

First, in the first step S310, change of the bit line voltage with time was measured at a guarantee temperature of 85° C. and an acceleration temperature of 125° C. by using an evaluation ferroelectric capacitor having the same structure as that of a ferroelectric capacitor of the ferroelectric memory device. Note that this step was conducted as follows according to the flowchart of FIG. 12:

First, in the first step S310a, a negative voltage pulse of −1.8 V was applied to the ferroelectric capacitor so that polarization of the negative direction was retained therein.

In the second step S310b, the retained polarization of the negative direction was stored for two hours at 85° C.

In the third step S310c, a positive voltage pulse of +1.8V was applied to the ferroelectric capacitor to read the data with inversion of the polarization state, and a polarization-voltage hysteresis curve was measured.

In the fourth step S310d, a bit line voltage is graphically determined from the intersection of the measured polarization-voltage hysteresis curve and the bit line capacitance load line.

Figure 14:
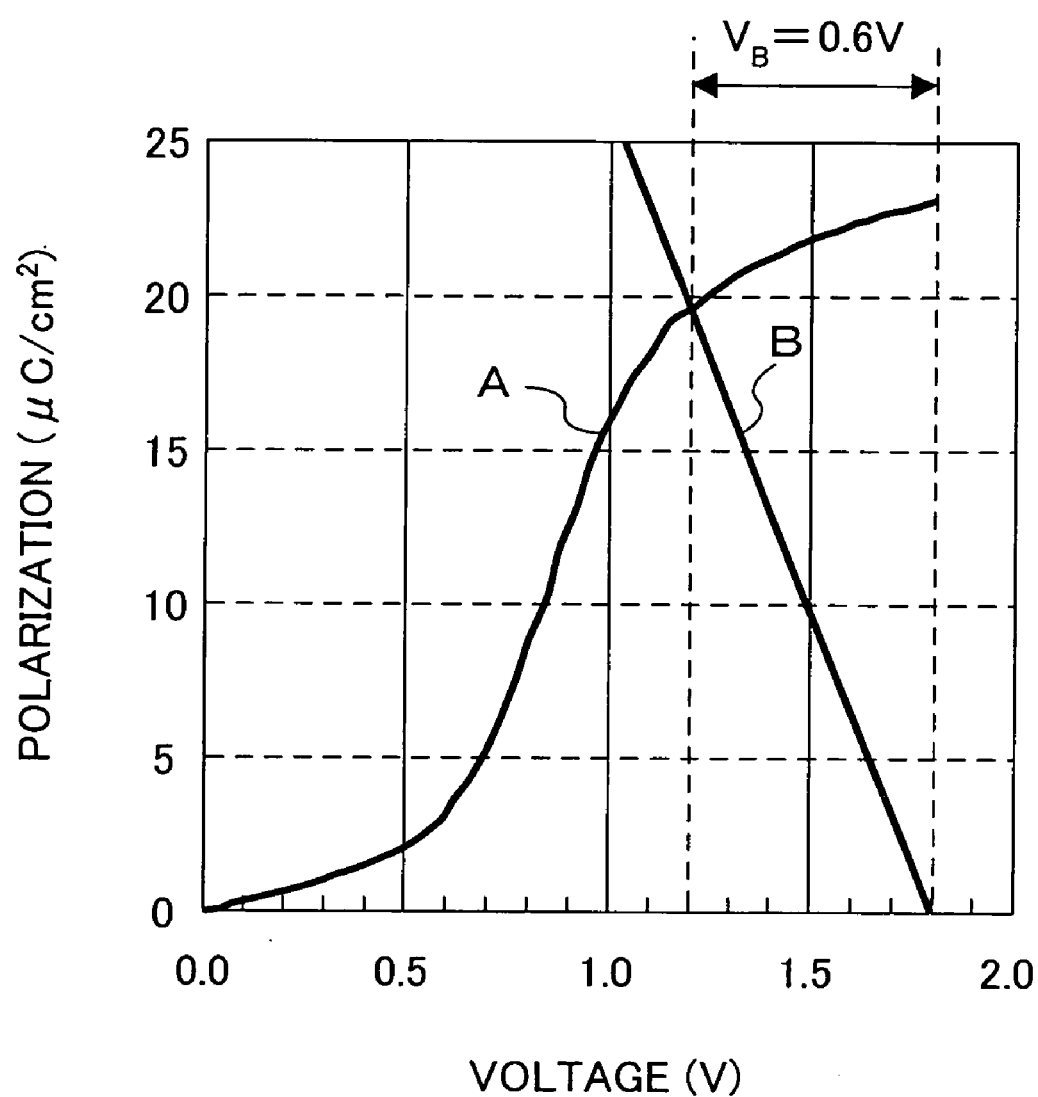
FIG. 14 shows a method for graphically determining a bit line voltage according to an example of the present invention.

FIG. 14 is a graph for determining the bit line voltage in the fourth step S310d. The curve A is a hysteresis curve that was measured by applying a positive voltage pulse of +1.8V in the read operation in the third step S310c. The line B is a bit line capacitance load line. In the ferroelectric memory device used in this example, the voltage $V_{CC}$ that was applied to the plate line in the read operation was 1.8 V, and the bit line capacitance $C_B$ was 32.4 µF/cm². Therefore, the line B was produced so that the intercept of the voltage axis was 1.8 V and the gradient was 32.4 µF/cm². As shown in FIG. 14, the voltage value at the intersection of the curve A and the line B is 1.2V. Therefore, the bit line voltage was determined as 0.6 V.

Thereafter, change of the bit line voltage with time at the guarantee temperature of 85° C. was measured by using ferroelectric capacitors other than the ferroelectric capacitor used in the above steps. This measurement was conducted by the same steps as those above except the storage time in the second step S310b was changed to 24 hours, 120 hours, and 540 hours. Moreover, change of the bit line voltage with time at the acceleration temperature of 125° C. was also measured by the same steps as those described above except the storage temperature of the second step S310b was changed to 125° C.

In the second step S311, the bit line voltage after the guarantee time of 10 years at the guarantee temperature of 85° C. was obtained as follows based on the change of the bit line voltage with time at the guarantee temperature of 85° C. which was measured in the first step S310.

Figure 15:
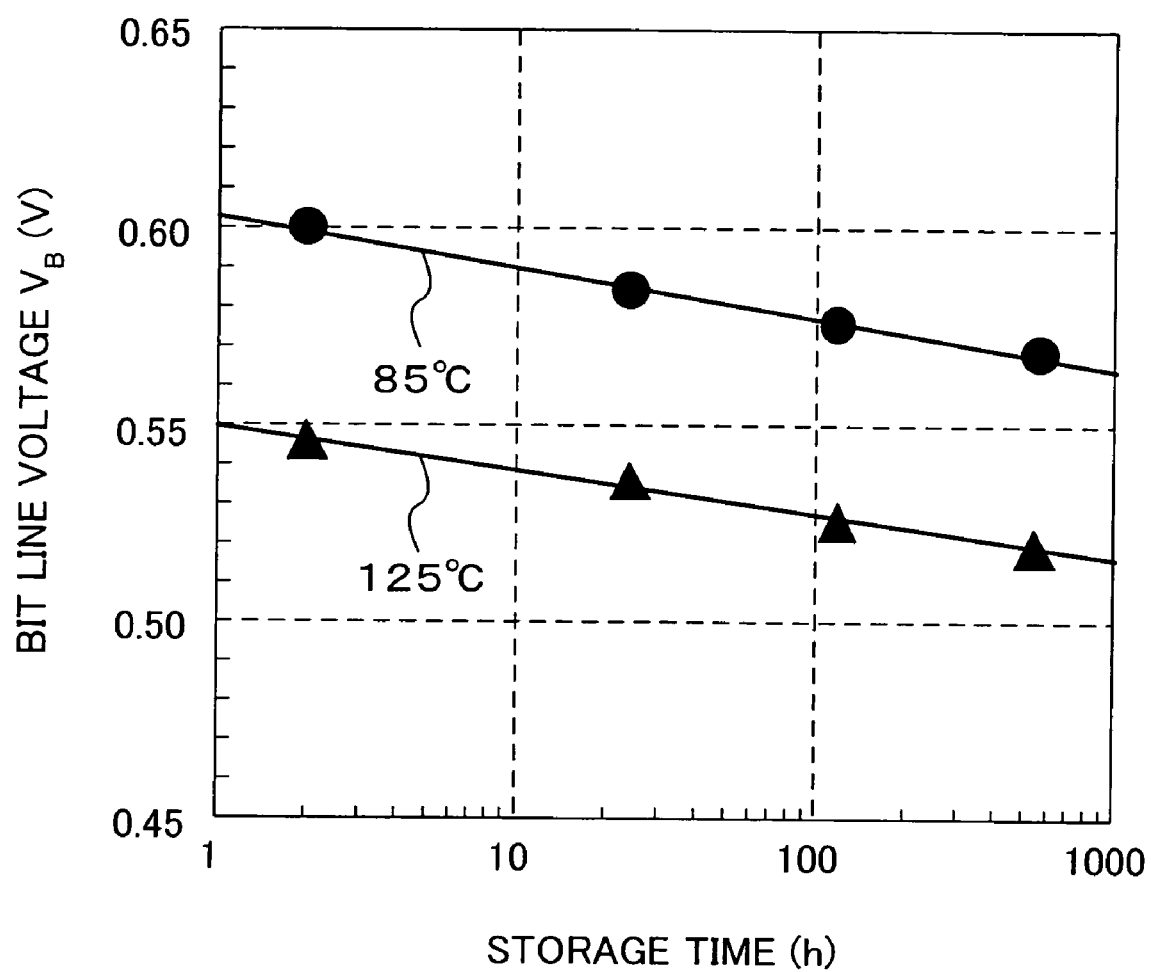
FIG. 15 shows respective changes of a bit line voltage with time at a guarantee temperature and an acceleration temperature according to an example of the present invention.

FIG. 15 is a graph in which the change of the bit line voltage with time at the guarantee temperature of 85° C. and the acceleration temperature of 125° C. which was measured in this example is plotted against the logarithm of time.

As shown in FIG. 15, change of the bit line voltage $V_B$ with time is linear with respect to the logarithm of time. These regression lines are represented by the following equations (28) and (29) for 85° C. and 125° C., respectively:

$$V_B=0.603-0.00558\cdot\ln[t] \text{ (85° C.)} \quad (28)$$

$$V_B=0.550-0.00483\cdot\ln[t] \text{ (125° C.)} \quad (29)$$

Accordingly, the bit line voltage $V_B'$ after ten years (87,600 hours) at 85° C. was obtained as shown by the following equation (30) by using an equation of an approximated line of the equation (28):

$$V_B'=0.603-0.00558\cdot\ln[87600]=0.539(V) \quad (30)$$

In the third step S312, the time the bit line voltage reaches the value $V_B'$ at the acceleration temperature of 125° C. was obtained as follows based on the change of the bit line voltage with time at the acceleration temperature of 125° C. which was measured in the first step S310:

The change of the bit line voltage $V_B$ with time at 125° C. was represented by the regression line equation (29), and the value $V_B$ was calculated as 0.539 in the equation (30). Therefore, the time the bit line voltage reaches the value $V_B'$ at 125° C. was calculated as shown by the following equation (31):

$$t=\exp[(0.550-0.539)/0.00483]\approx 9(h) \quad (31)$$

Therefore, the time thus calculated was determined as the test time $t_2$ of the high-temperature storing step S200.

Finally, whether the data can be read or not was examined in the reading examining step S400. In this example, read failure of the data did not occur. Therefore, it can be evaluated that the retention characteristics are guaranteed for the guarantee time of ten years at the guarantee temperature of 85° C.

Figure 25:
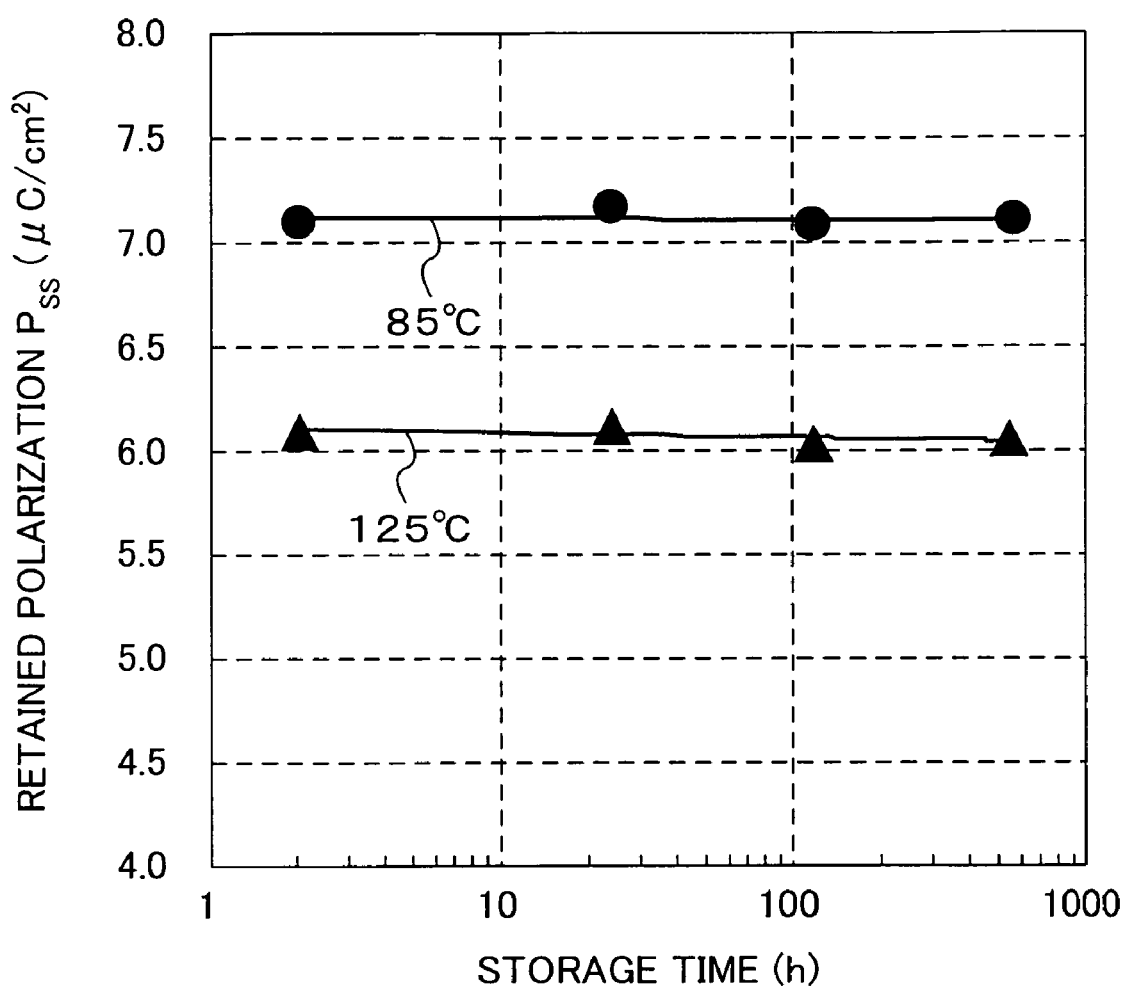
FIG. 25 shows change of retained polarization with time in a conventional reliability test method for a ferroelectric memory device.

In the conventional retention characteristic test method for a ferroelectric memory device, test time is determined based on temperature dependence of change of retained polarization with time in the test-time determining step S300. However, retained polarization is not appropriate as a parameter relating to the retention characteristics. As shown in FIG. 25, since retained polarization does not change with time, it is impossible to determine the test time. Therefore, the reliability test for evaluating the life of the retention characteristics cannot be carried out.

On the other hand, a bit line voltage that is appropriate as a parameter relating to the retention characteristics is selected in the retention characteristic test method of this example. Since change of the bit line voltage with time can be obtained as shown in FIG. 15, the test time $t_2$ at the acceleration temperature $T_2$ can be easily and reliably determined. As a result, the reliability test for evaluating the life of the retention characteristics of the ferroelectric memory device can be reliably carried out.

SECOND EXAMPLE

Hereinafter, a second example of the method for testing retention characteristics of a ferroelectric memory device according to an embodiment of the present invention will be described with reference to the drawings.

In the retention characteristic test of the ferroelectric memory device of this example, the test for evaluating whether or not the retention characteristics can be guaranteed for the guarantee time of 10 years at the guarantee temperature of 85° C. is conducted without determining the acceleration temperature in advance.

The retention characteristic test of the ferroelectric memory device in this example is conducted according to the flowchart of FIG. 1.

First, in the data writing step S100, data of one direction was written to the ferroelectric memory device. Note that the data was written to the ferroelectric memory device by applying a unipolar voltage pulse of 1.8 V to a ferroelectric capacitor of the ferroelectric memory device. The data was written in such a direction that the data is read with inversion of the polarization direction of the ferroelectric capacitor (the direction in which retention failure may occur).

In the high-temperature storing step S200, the ferroelectric memory device was stored for nine hours at 125° C.

The storage time in the high-temperature storing step S200 was determined as follows according to the flowchart of the test-time determining step S300 in FIG. 13:

First, in the step S320, temperature dependence of the polarization $P_{SS}$ that is retained in the ferroelectric capacitor when the data is written to the ferroelectric memory device was measured. In this example, this step was conducted as follows:

FIG. 16 is a flowchart showing four steps that are conducted in the first step S320 in the second example.

As shown in FIG. 16, in the first step S320a, a pair of evaluation ferroelectric capacitors each having the same structure as that of a ferroelectric capacitor of the ferroelectric memory device was prepared. A positive voltage pulse of +1.8 V was applied to one of the evaluation ferroelectric capacitors so that polarization of the positive direction was retained therein. A negative voltage pulse of -1.8 V was applied to the other evaluation ferroelectric capacitor so that polarization of the negative direction was retained therein.

In the second step S320b, the pair of ferroelectric capacitors retaining polarization was stored for 24 hours at 85° C.

Figure 17A:
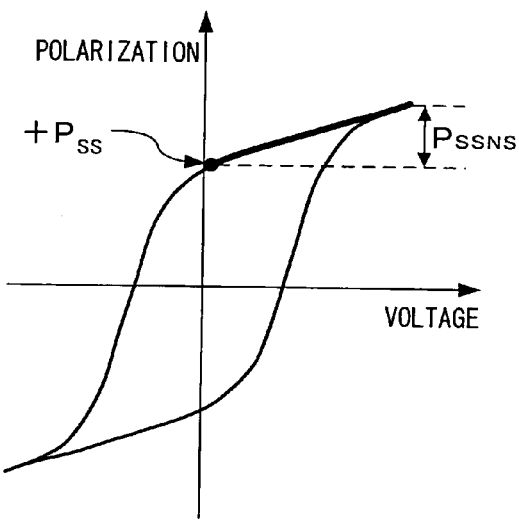
FIGS. 17A, 17B, and 17C show the relation between retained polarization of a ferroelectric capacitor and the amount of polarization read from the ferroelectric capacitor.
Figure 17B:
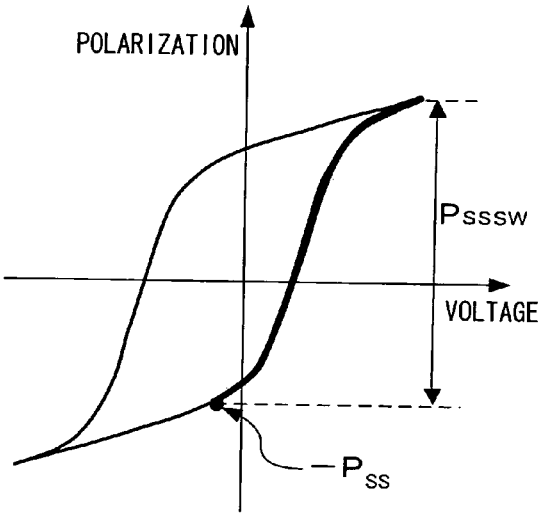

In the third step S320c, the retained polarization was read from both ferroelectric capacitors by applying a positive voltage pulse of +1.8 V, and the amount of read polarization was measured. FIGS. 17A and 17B show the amount of polarization that was read from the ferroelectric capacitors retaining the polarization $+P_{SS}$ of the positive direction and the polarization $-P_{SS}$ of the negative direction, respectively. As shown in FIG. 17A, the polarization direction is not inverted when the polarization is read from the ferroelectric capacitor retaining the polarization $+P_{SS}$ of the positive direction, and the amount of polarization read from this ferroelectric capacitor is $P_{SSNS}$. On the other hand, as shown in FIG. 17B, the polarization direction is inverted when the polarization is read from the ferroelectric capacitor retaining the polarization $-P_{SS}$ of the negative direction, and the amount of polarization read from this ferroelectric capacitor is $P_{SSSW}$.

Figure 17C:
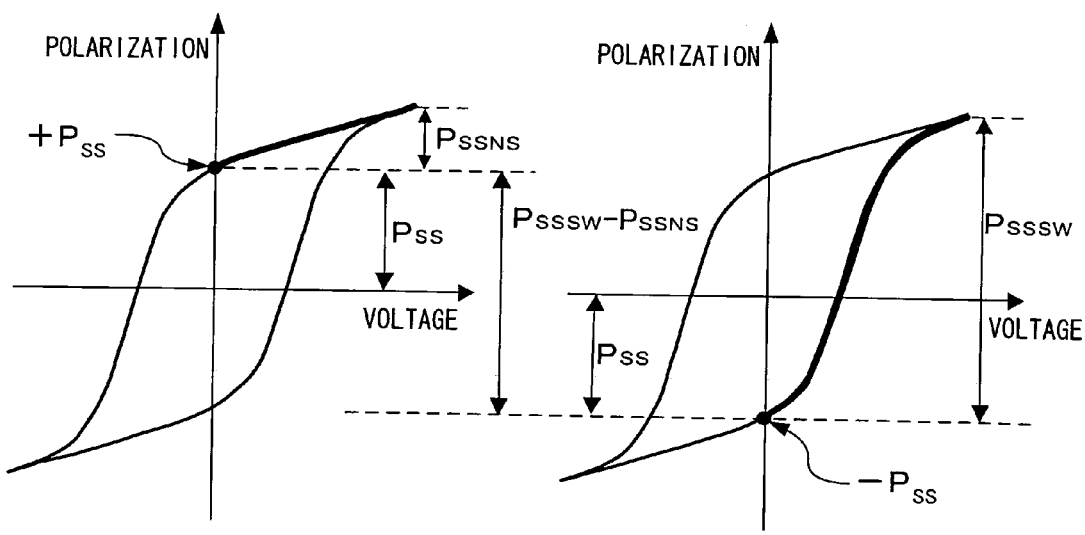

In the fourth step S320d, the retained polarization $P_{SS}$ was calculated based on the amount of polarization that was measured in the third step S320c. As shown in FIG. 17C, in view of the positive-negative symmetry of the retained polarization, the difference between $P_{SSSW}$ and $P_{SSNS}$ is equal to twice the value $P_{SS}$. Therefore, the retained polarization $P_{SS}$ can be calculated by the following equation (32):

$$P_{SS}=(P_{SSSW}-P_{SSNS})/2 \quad (32)$$

Pairs of evaluation ferroelectric capacitors other than the pair of ferroelectric capacitors used in the above steps were prepared. The same steps as those described above (the first to fourth steps S320a to S320d) were conducted for the pairs of evaluation ferroelectric capacitors except that the storage temperature in the second step S320b was changed to 110° C., 125° C., and 150° C. Temperature dependence of the retained polarization $P_{SS}$ was thus measured.

In the second step S321 of FIG. 13, the Curie temperature $T_C$ and the constant A were determined as follows based on the measured temperature dependence of the retained polarization $P_{SS}$.

Figure 18:
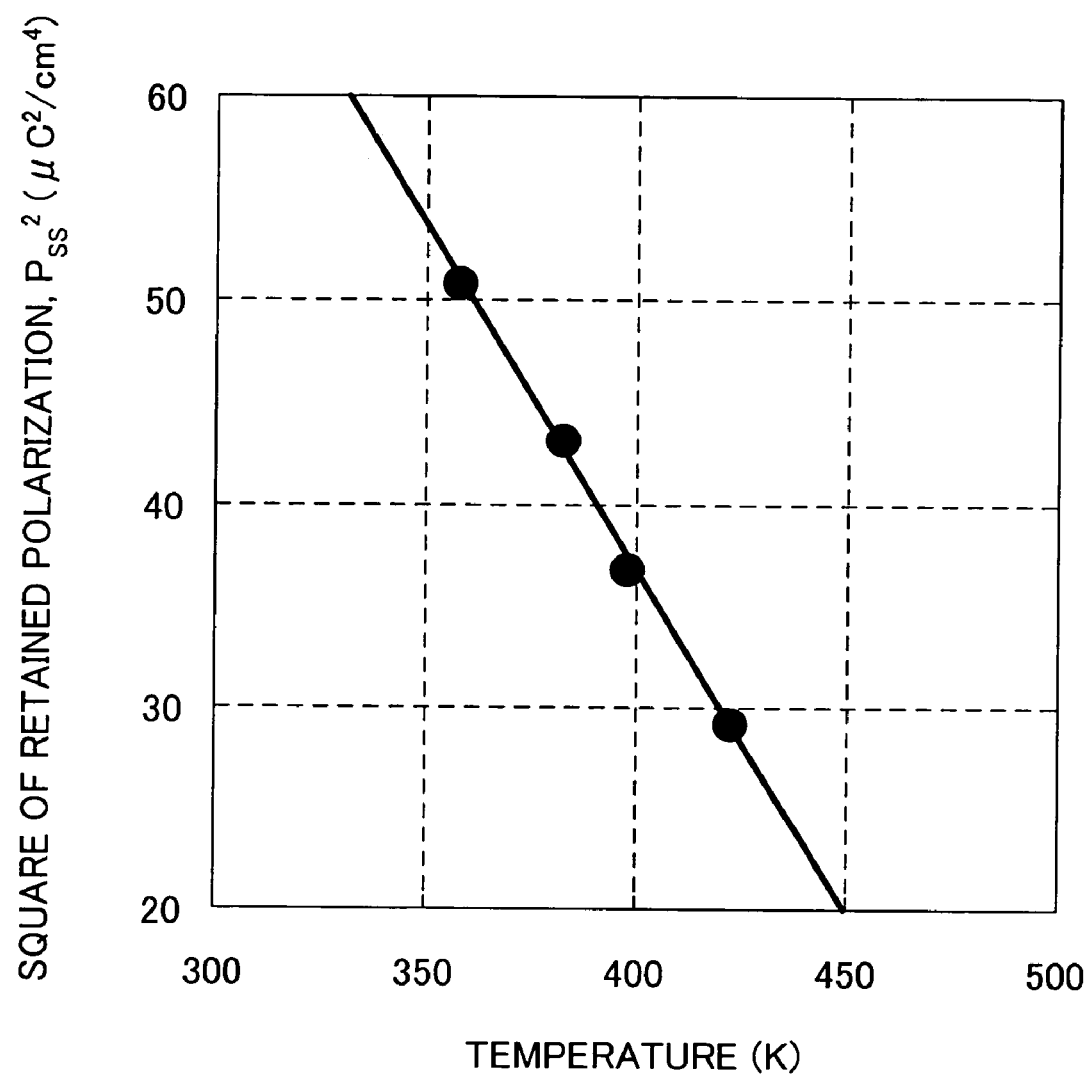
FIG. 18 shows temperature dependence of retained polarization according to an example of the present invention.

FIG. 18 is a graph that plots the square of the retained polarization $P_{SS}$ at each temperature of this example against temperature. As shown in FIG. 18, the square of the retained polarization $P_{SS}$ and the temperature have a linear relation, and the gradient a and the intercept b of the regression line are −0.338 and 172.1, respectively. The Curie temperature $T_C$ and the constant A were determined as 508.6 (K) and 0.338 ($\mu C^2/cm^4 \cdot K$) based on the equations (23) and (24), respectively.

In the third step S322, temperature dependence of change with time of the bit line voltage that was generated when the data written to the ferroelectric memory device was read was measured. Note that, in the third step S322, the bit line voltage was measured according to the flowchart of the steps S310a to S310d in FIG. 12 by using evaluation ferroelectric capacitors each having the same structure as that of the ferroelectric capacitor of the ferroelectric memory device. More specifically, in the third step S322, the bit line voltage was measured by the same procedures as those described in the first step S310 of FIG. 11 in the first example. However, in addition to the temperatures of 85° C. and 125° C. of the first example, the temperatures of 110° C. and 150° C. were also used as the storage temperature in the second step S310b.

Figure 19:
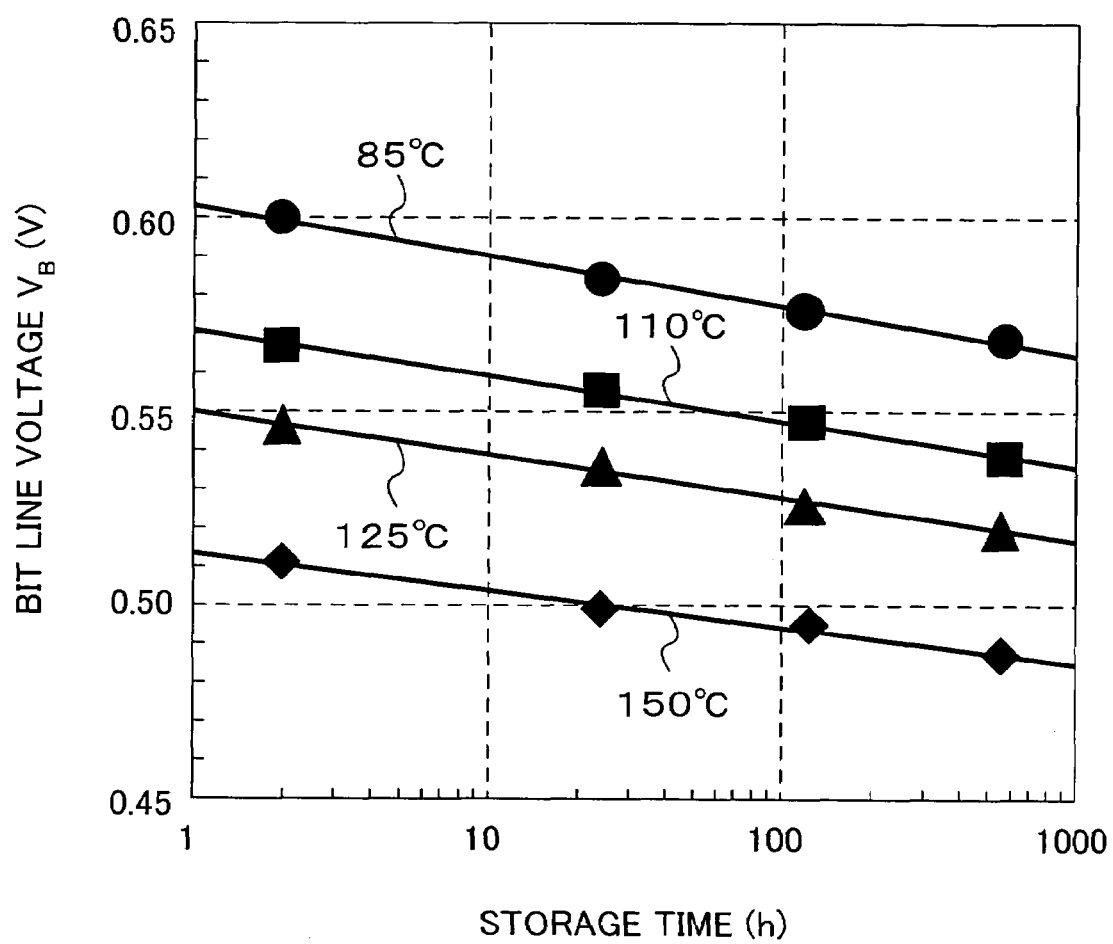
FIG. 19 shows temperature dependence of change of a bit line voltage with time according to an example of the present invention.

In the fourth step S323, the constants $V_0$ and $R_0$ were determined as follows based on the measured temperature dependence of the change of the bit line voltage with time:

FIG. 19 is a graph that plots the change of the bit line voltage with time which was measured at each temperature in the third step S322 against the logarithm of time. The intercept c and the gradient d of the regression line of each temperature were as follows: c=0.603 (V), d=0.00558 (V/decade) for 85° C.; c=0.571 (V), d=0.00513 (V/decade) for 110° C.; c=0.550 (V), d=0.00483 (V/decade) for 125° C.; and c=0.513 (V), d=0.00422 (V/decade) for 150° C.

Figure 20:
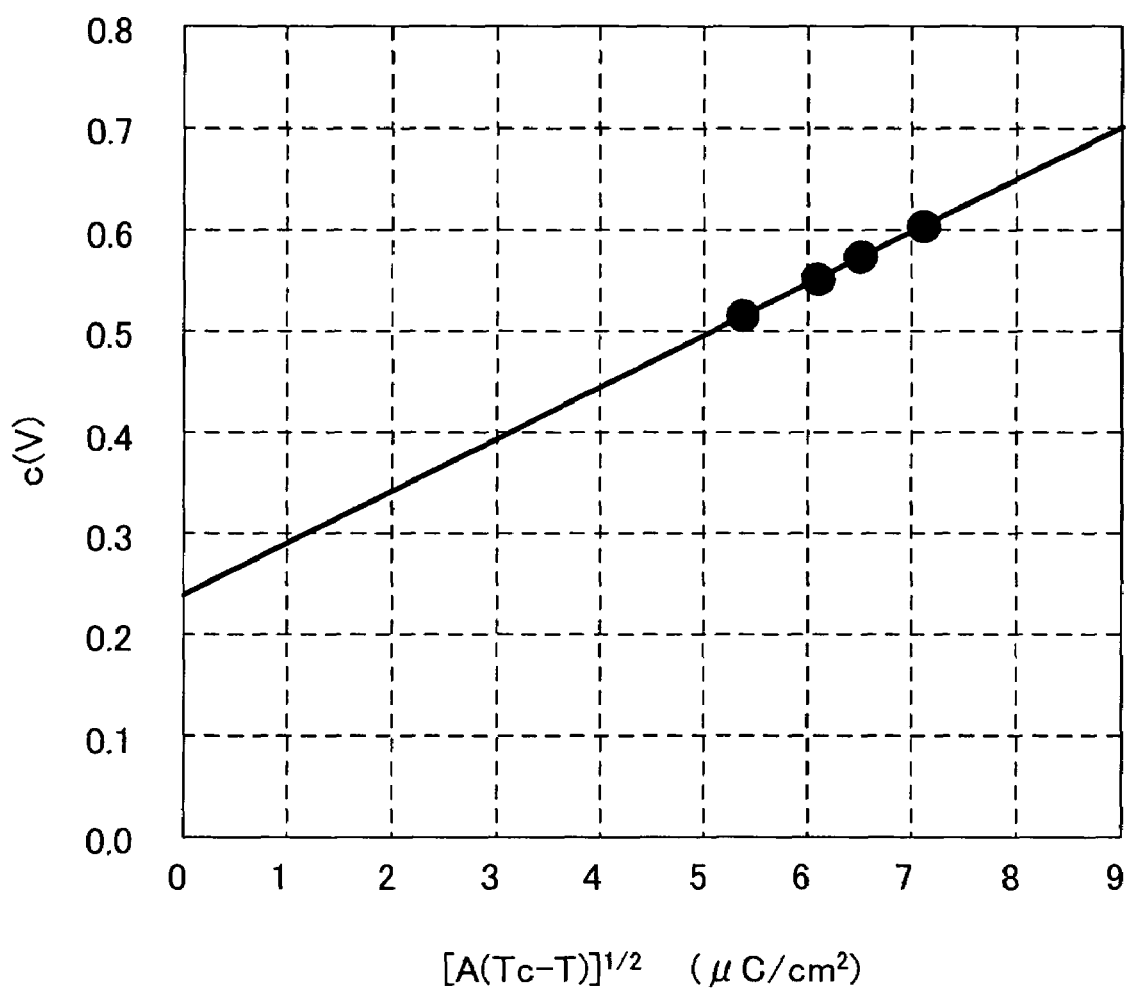
FIG. 20 is a graph that plots intercepts of regression lines of change of a bit line voltage with time which are obtained at a plurality of temperatures against the values of $[A(T^c-T)]^{1/2}$ which are obtained at the plurality of temperatures, respectively, according to an example of the present invention.

FIG. 20 is a graph that plots the intercept c for each temperature against the value $[A(T_C-T)]^{1/2}$ In for each temperature. Note that the value $[A(T_C-T)]^{1/2}$ for each temperature was calculated by using the Curie temperature $T_C$ and the constant A which were determined in the second step S321. As shown in FIG. 20, the intercept c and the value $[A(T_C-T)]^{1/2}$ have a linear relation, and the gradient, 0.0513 ($V \cdot cm^2/\mu C$), was determined as $V_0$ according to the equation (26).

Figure 21:
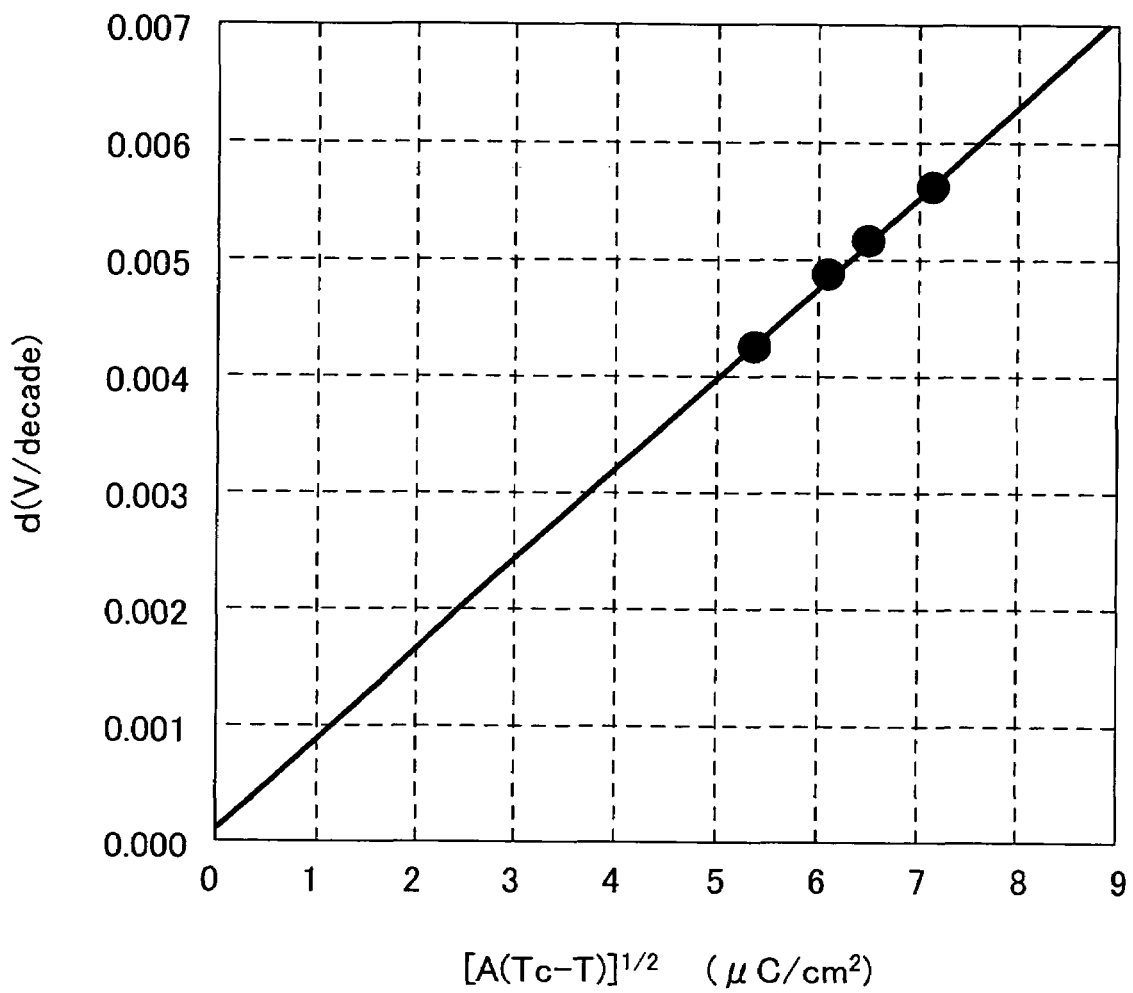
FIG. 21 is a graph that plots gradients of regression lines of change of a bit line voltage with time which are obtained at a plurality of temperatures against the values of $[A(T^c-T)]^{1/2}$ which are obtained at the plurality of temperatures, respectively, according to an example of the present invention.

FIG. 21 is a graph that plots the gradient d for each temperature against the value $[A(T_C-T)]^{1/2}$ for each temperature. As shown in FIG. 21, the gradient d is approximately proportional to $[A(T_C-T)]^{1/2}$, and the gradient, 0.000774 ($V \cdot cm^2/\mu C \cdot decade$) was determined as $R_0$ according to the equation (27).

Figure 22:
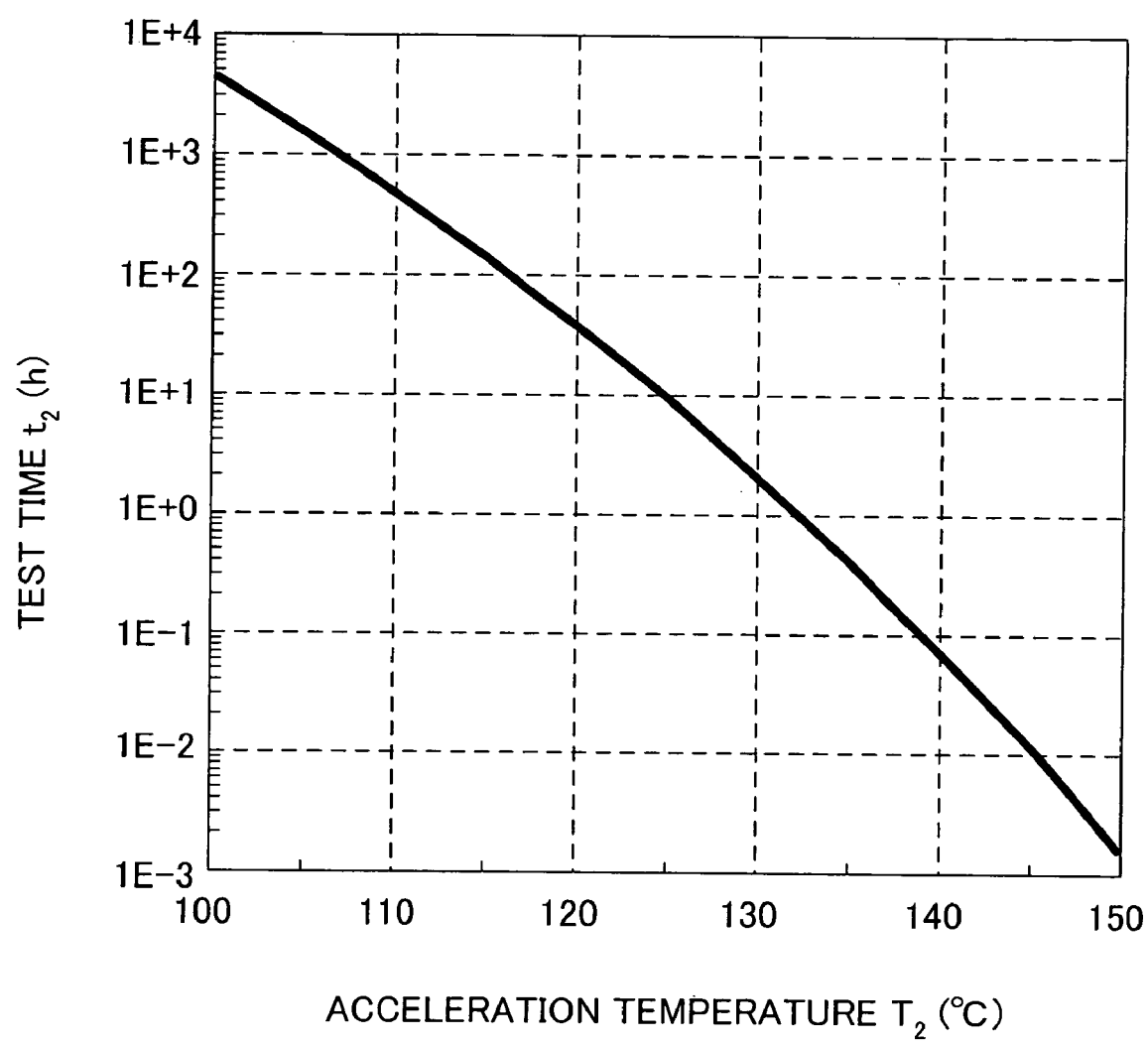
FIG. 22 shows the relation between test time and acceleration temperature according to an example of the present invention.
Figure 23:
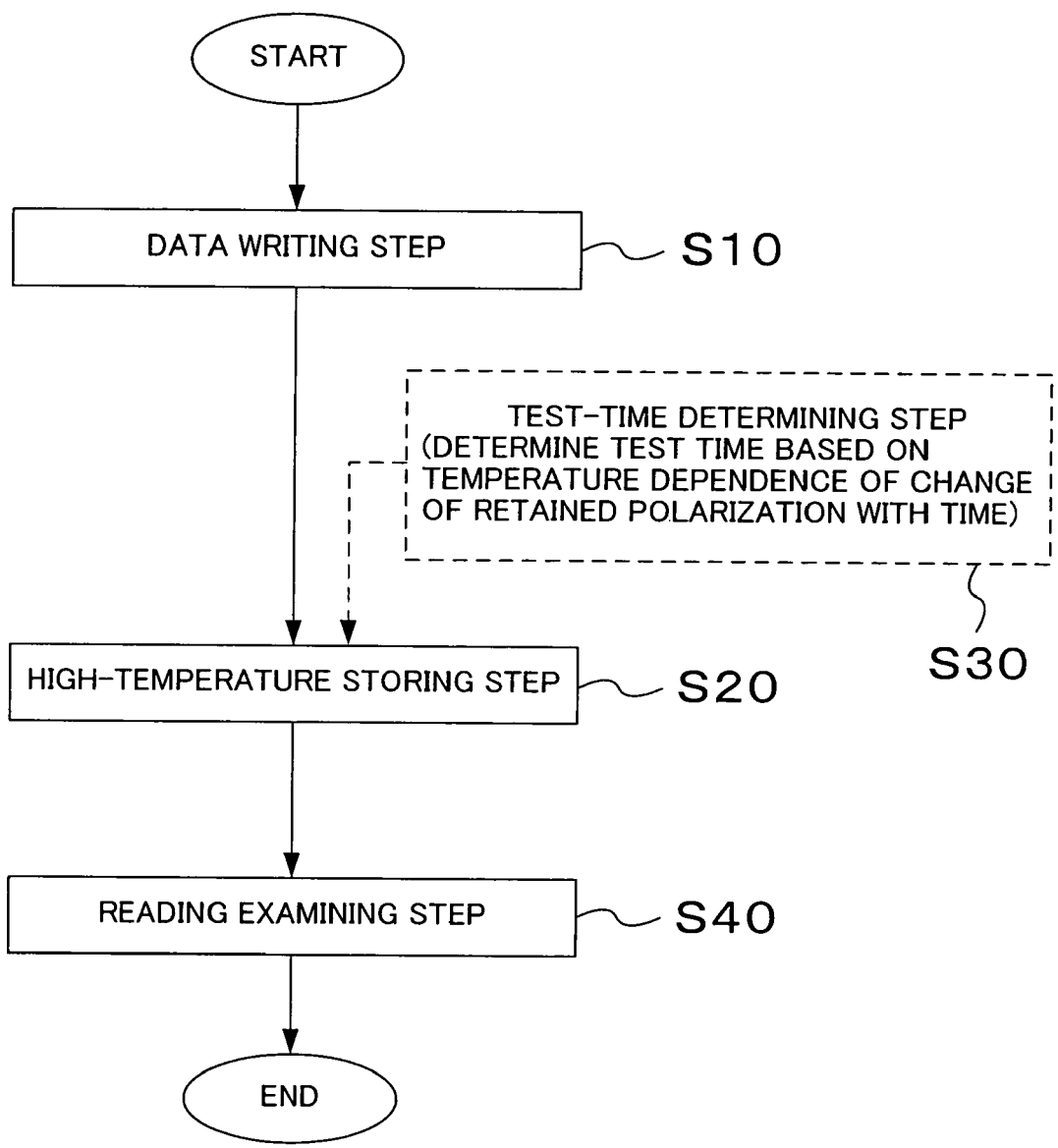
FIG. 23 shows a conventional reliability test method for a ferroelectric memory device.
Figure 24:
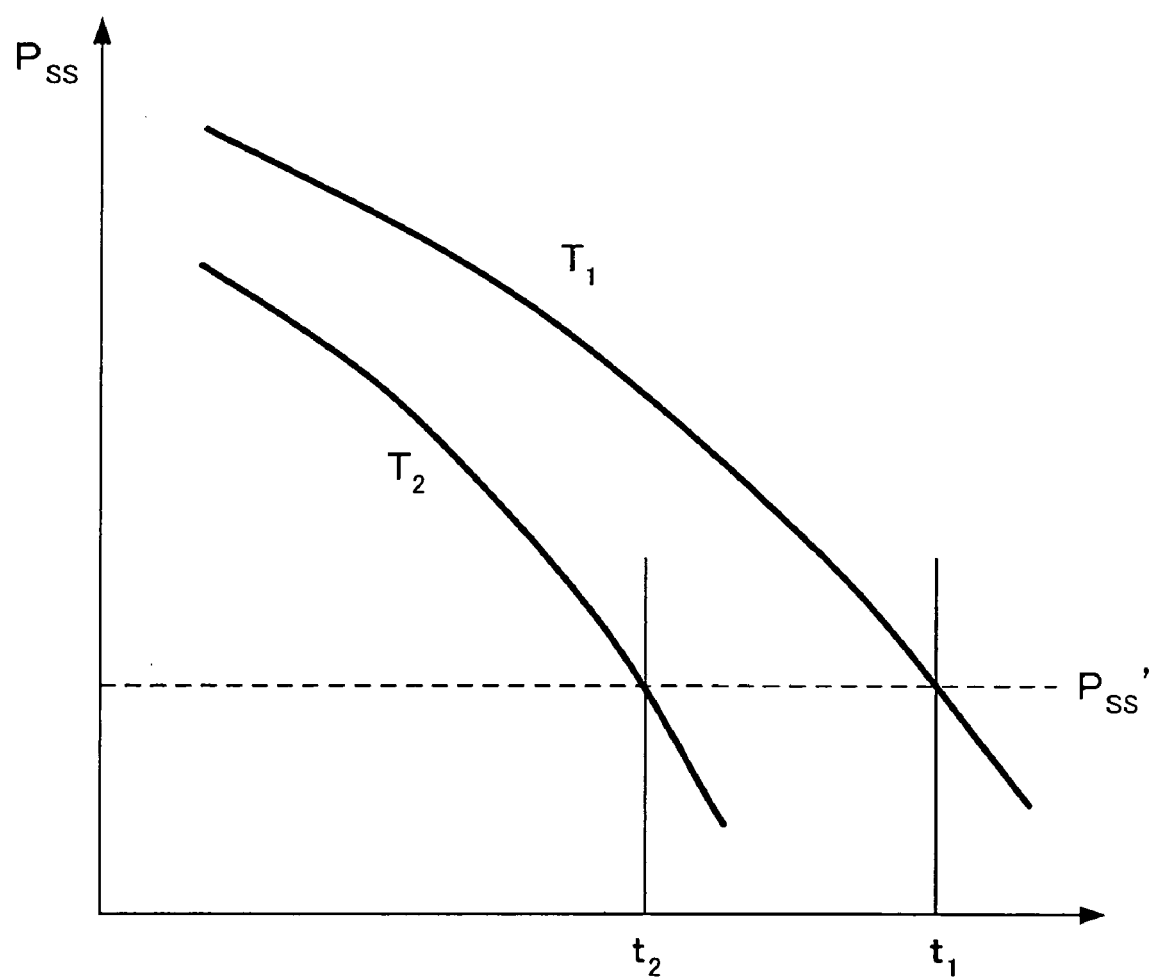
FIG. 24 shows a concept of determining test time based on temperature dependence of change of retained polarization with time in a conventional reliability test method for a ferroelectric memory device.

In the fifth step S324, the test time $t_2$ was calculated by substituting the obtained values of the acceleration parameters Tc, $V_0$ and $R_0$, the guarantee temperature (85° C.), and the guarantee time (10 years (87,600 hours)) into the acceleration model equation (22) with various acceleration temperatures $T_2$. The result is shown in FIG. 22. The acceleration temperature and the test time were determined as 125° C. and 9 hours from FIG. 22.

Finally, whether the data can be read or not was examined in the reading examining step S400 of FIG. 1. Read failure did not occur in this example. Accordingly, it can be evaluated that the retention characteristics are guaranteed for the guarantee time of 10 years at the guarantee temperature of 85° C.

In the retention test method of this example, the acceleration model equation that describes the test time $t_2$ as a function of the acceleration temperature $T_2$ is used in the storage-time determining step S300. Therefore, as shown in FIG. 22, the test time $t_2$ can be determined for any acceleration temperature $T_2$. Accordingly, unlike the first example, the acceleration temperature $T_2$ need not be determined before the test is started. This prevents problems (such as extremely short test time due to a too high acceleration temperature) which are caused by wrong setting of the acceleration temperature $T_2$. As a result, the reliability test for evaluating the life of the retention characteristics of the ferroelectric memory device can be conducted more reliably.

Note that, as has been described above, the reliability test method for a ferroelectric memory device according to the present invention is effective as, for example, a method for reliably and accurately conducting reliability test for evaluating the life of the retention characteristics of the ferroelectric memory devices.

What is claimed is:

1. A reliability test method for a ferroelectric memory device having a ferroelectric capacitor for evaluating, under acceleration conditions (acceleration temperature $T_2$ and test time $t_2$), whether or not life of retention characteristics of the ferroelectric memory device is guaranteed under actual use conditions (guarantee temperature $T_1$ and guarantee time $t_1$), comprising the step of:

determining test time $t_2$ that is required to evaluate whether the life of the retention characteristics is guaranteed or not, based on temperature dependence of change with time of a bit line voltage that is generated when data written to the ferroelectric memory device is read.

2. The method according to claim 1, further comprising the steps of:

writing data to the ferroelectric memory device;
   storing the data written to the ferroelectric memory device at the acceleration temperature $T_2$ for the test time $t_2$ determined by the step of determining the test time $t_2$; and
   examining, after the step of storing the data, whether or not the data written to the ferroelectric memory device can be read.

3. The method according to claim 1, wherein the bit line voltage is determined based on an intersection of a polarization-voltage hysteresis curve obtained by using an independent ferroelectric capacitor for evaluation which has the same structure as that of the ferroelectric capacitor of the ferroelectric memory device and a bit line capacitance load line of the ferroelectric memory device, and the polarization-voltage hysteresis curve is obtained by reading retained polarization corresponding to data written to the ferroelectric memory device from the independent ferroelectric capacitor.

4. The method according to claim 1, wherein the test time $t_2$ is determined based on respective changes of the bit line voltage with time at the guarantee temperature $T_1$ and the acceleration temperature $T_2$.

5. The method according to claim 4, wherein the test time $t_2$ is determined by obtaining a value of the bit line voltage after the guarantee time $t_1$ at the guarantee temperature $T_1$ based on the change of the bit line voltage with time at the guarantee temperature $T_1$ and then obtaining, based on the change of the bit line voltage with time at the acceleration temperature $T_2$, a time period required for the bit line voltage at the acceleration temperature $T_2$ to reach the value of the bit line voltage after the guarantee time $t_1$ at the guarantee temperature $T_1$.

6. The method according to claim 1, wherein the test time $t_2$ is determined by using an acceleration model equation that is derived based on the temperature dependence of the change of the bit line voltage with time and that describes the test time $t_2$ as a function of the acceleration temperature $T_2$.

7. The method according to claim 6, wherein the acceleration model equation is shown by the following equation:

$$\ln[t_2]=[(T_C-T_1)/(T_C-T_2)]^{1/2}\cdot\ln[t_1]+\{1-[(T_C-T_1)/(T_C-T_2)]^{1/2}\}\cdot(V_0/R_0),$$

where $T_C$ is a Curie temperature, and $V_0$ and $R_0$ are constants.

8. The method according to claim 7, wherein a value of $T_C$ in the acceleration model equation is determined by measuring temperature dependence of polarization $P_{SS}$ that is retained in the ferroelectric capacitor when data is written to the ferroelectric memory device.

9. The method according to claim 7, wherein a value of $T_C$ in the acceleration model equation is determined based on a gradient and an intercept of a regression line that is obtained by plotting, against temperature, a square of polarization $P_{SS}$ that is retained in the ferroelectric capacitor when data is written to the ferroelectric memory device.

10. The method according to claim 7, wherein respective values of $V_0$ and $R_0$ in the acceleration model equation are determined by measuring temperature dependence of the change of the bit line voltage with time.

11. The method according to claim 7, wherein a value of $V_0$ in the acceleration model equation is determined from a gradient of a regression line that is obtained by plotting intercepts of regression lines at a plurality of temperatures against values of $[A(T_C-T)]^{1/2}$ at the plurality of temperatures, respectively (where $T_C$ is a Curie temperature and A is a constant), and the regression lines at the plurality of temperatures are obtained by plotting the temperature dependence of the change of the bit line voltage with time against a logarithm of time.

12. The method according to claim 7, wherein a value of $R_0$ in the acceleration model equation is determined from a gradient of a regression line that is obtained by plotting gradients of regression lines at a plurality of temperatures against values of $[A(T_C-T)]^{1/2}$ at the plurality of temperatures, respectively (where $T_C$ is a Curie temperature and A is a constant), and the regression lines at the plurality of temperatures are obtained by plotting the temperature dependence of the change of the bit line voltage with time against a logarithm of time.

13. The method according to claim 11, wherein respective values of $T_C$ and A are determined from a gradient and an intercept of a regression line that is obtained by plotting, against temperature, a square of polarization $P_{SS}$ that is retained in the ferroelectric capacitor when data is written to the ferroelectric memory device.

* * * * *